(12) United States Patent
Kwon et al.

(10) Patent No.: US 11,474,149 B2
(45) Date of Patent: Oct. 18, 2022

(54) TEST APPARATUSES FOR TESTING SEMICONDUCTOR PACKAGES AND MANUFACTURING SYSTEMS FOR MANUFACTURING SEMICONDUCTOR PACKAGES HAVING THE SAME AND METHODS OF MANUFACTURING THE SEMICONDUCTOR PACKAGES USING THE SAME

(71) Applicant: Samsung Electronics Co., Ltd., Suwon-si (KR)

(72) Inventors: Chansik Kwon, Asan-si (KR); Junyoung Ko, Cheonan-si (KR); Jongkeun Moon, Asan-si (KR); Jinduck Park, Asan-si (KR); Jiyeon Han, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 216 days.

(21) Appl. No.: 16/916,679

(22) Filed: Jun. 30, 2020

(65) Prior Publication Data

US 2021/0141014 A1 May 13, 2021

(30) Foreign Application Priority Data

Nov. 7, 2019 (KR) .......................... 10-2019-0142135

(51) Int. Cl.
*G01R 31/26* (2020.01)
*G01R 31/28* (2006.01)
*H01L 21/66* (2006.01)

(52) U.S. Cl.
CPC ..... *G01R 31/2894* (2013.01); *G01R 31/2891* (2013.01); *G01R 31/2896* (2013.01); *H01L 22/14* (2013.01)

(58) Field of Classification Search
CPC ............ G01R 31/2891; G01R 31/2894; G01R 31/2896; G01R 31/2875; G01R 31/2877;
(Continued)

(56) References Cited

U.S. PATENT DOCUMENTS 6,879,172 B1 4/2005 Eppes et al.
7,323,888 B1 1/2008 Colvin
(Continued)

FOREIGN PATENT DOCUMENTS

KR 10-1528200 B1 6/2015
KR 10-2015-0088206 A 7/2015

*Primary Examiner* — Thang X Le
(74) *Attorney, Agent, or Firm* — Harness, Dickey & Pierce, P.L.C.

(57) ABSTRACT

A test apparatus includes a test chamber in which a plurality of the semiconductor packages having a plurality of component dies is secured, an operation tester configured to conduct an operation test to the plurality of semiconductor packages to detect whether at least one semiconductor package is an operation fault package having a fault and identify a fault package point at which the operation fault package is located, a fault heat detector configured to detect a fault heat generated from the fault, and a test controller configured to control the operation tester to conduct the operation test to the plurality of semiconductor packages and control the fault heat detector subsequent to the operation test to detect the fault heat generated from the fault of the operation fault package to determine a vertical point of the fault and to determine a fault die having the fault.

20 Claims, 8 Drawing Sheets

(58) Field of Classification Search
CPC .......... G01R 31/2862; G01R 31/2867; G01R 31/3008; G01R 31/3004; G01R 31/318307; G01R 31/2884; G01R 31/31924; G01R 31/31922; G01R 31/318511; G01R 31/318505; G01R 31/2831; G01R 31/318513; G01R 31/31905; G01R 31/2632; G01R 31/2635; G01R 31/2608; G01R 31/2614; G01R 31/2621; G01R 31/275
See application file for complete search history.

(56) References Cited

U.S. PATENT DOCUMENTS

| | | | |
|---|---|---|---|
| 7,339,391 | B2 | 3/2008 | Lin |
| 7,664,608 | B2 | 2/2010 | Urano et al. |
| 8,742,347 | B2 | 6/2014 | Altmann et al. |
| 8,797,052 | B2 | 8/2014 | Colvin |
| 9,417,309 | B1 * | 8/2016 | Fan ................ G01R 35/005 |
| 9,500,599 | B2 | 11/2016 | Mun et al. |
| 2010/0062550 | A1 | 3/2010 | Buchel et al. |
| 2012/0098957 | A1 * | 4/2012 | Deslandes ........... G01R 31/311 348/92 |
| 2020/0003825 | A1 * | 1/2020 | Liu ................. H01L 21/67288 |
| 2020/0075431 | A1 * | 3/2020 | Jacobs ................ H01L 23/481 |

* cited by examiner

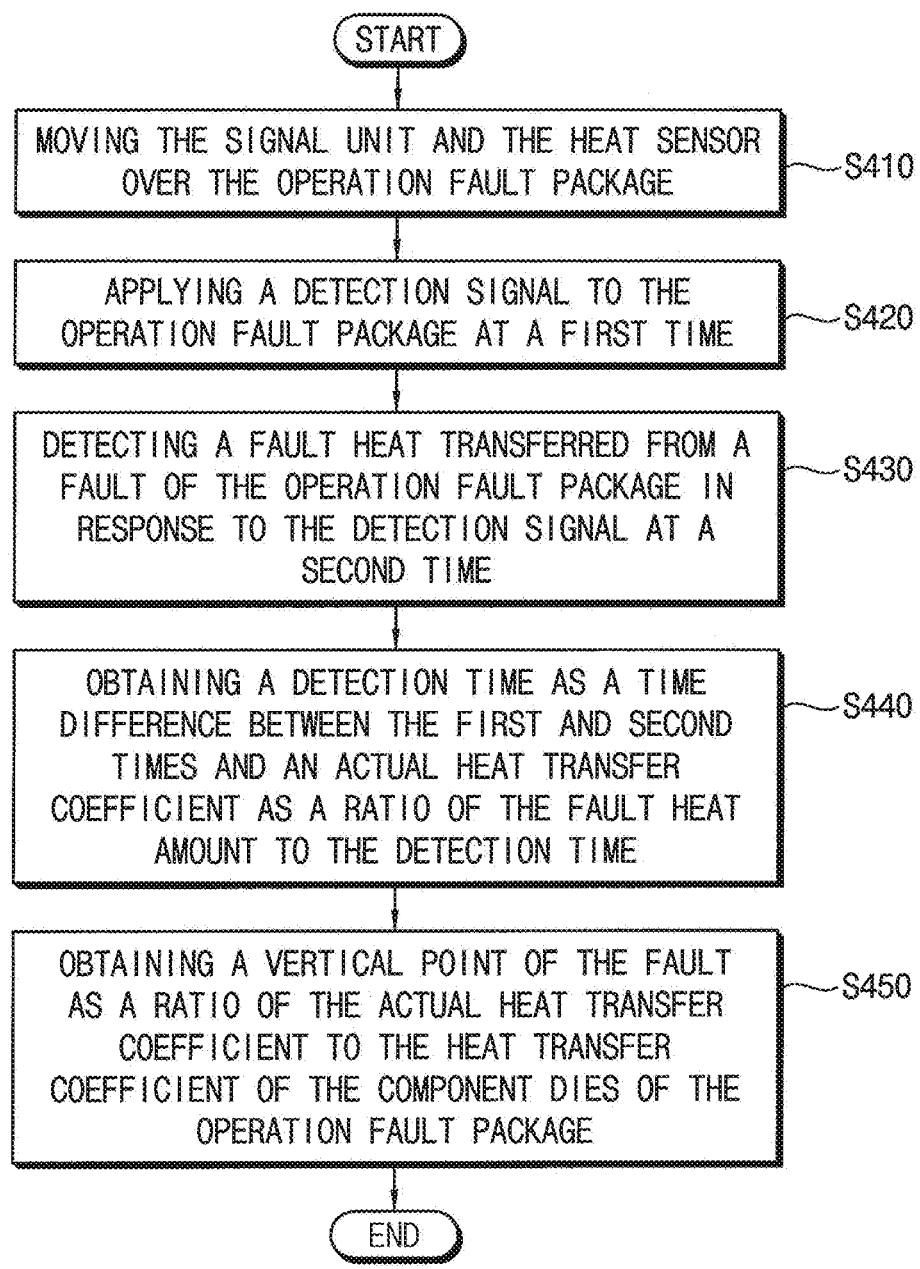

TEST APPARATUSES FOR TESTING SEMICONDUCTOR PACKAGES AND MANUFACTURING SYSTEMS FOR MANUFACTURING SEMICONDUCTOR PACKAGES HAVING THE SAME AND METHODS OF MANUFACTURING THE SEMICONDUCTOR PACKAGES USING THE SAME

CROSS-REFERENCE TO RELATED APPLICATION

This application claims priority under 35 U.S.C. § 119 to Korean Patent Application No. 10-2019-0142135 filed on Nov. 7, 2019 in the Korean Intellectual Property Office, the contents of which are incorporated by reference herein in its entirety.

BACKGROUND

1. Field

Example embodiments relate to test apparatuses for testing semiconductor packages and manufacturing systems having the same and methods of manufacturing the semiconductor packages using the same, and more particularly, to test apparatuses in which an operation test and a fault detection process are conducted in the same test chamber, and manufacturing systems having the same and methods of manufacturing the semiconductor packages using the same.

2. Description of the Related Art

When a plurality of component dies is stacked on chips of a wafer and a chip stack package is manufactured in the die bonding apparatus, an operation test is firstly conducted to the chip stack packages and the non-operating chip stack packages are detected as operation fault packages. Then, the chip stack packages on the wafer are separated by a unit of the chip on the wafer by a sawing process and a plurality of individual chip stack packages may be provided. The individual chip stack packages may be sorted into well-operating normal packages and the non-operating fault packages. Thereafter, a fault detection process is conducted only to the operation fault packages. As result of the fault detection, a vertical point of the inner fault and a fault die having the inner fault are detected in the operation fault package.

The fault detection results are generally transferred to the die bonding apparatus via a data feedback for increasing the reliability of the chip stack packages. For example, the fault position is transferred to the die bonding apparatus and the bonding conditions may be changed or controlled for avoiding the fault die when another chip stack package is manufactured in the same die boding apparatus.

However, as it takes a large time for the feedback of the fault detection results to the die bonding apparatus, the bonding correction at the fault position is so late that a large number of the operation fault packages are manufactured until the fault position is fed back to the die bonding apparatus.

For example, when it takes 5 days for transferring the fault position to the die bonding apparatus and thus the feedback time to the die bonding apparatus is a 5-day, some of the chip stack packages manufactured in the 5-day feedback time necessarily includes the fault die and is sorted into the operation fault package.

SUMMARY

Example embodiments of the present inventive concepts provide a test apparatus for testing semiconductor packages in which the operation test and the fault detection are conducted in the same test chamber for reducing the feedback time of the defect die.

Some example embodiments of the present inventive concepts provide a manufacturing system for manufacturing the semiconductor packages having the above test apparatus.

Some example embodiments of the present inventive concepts provide a method of manufacturing semiconductor packages in the above manufacturing system.

According to some example embodiments of the inventive concepts, a test apparatus for testing a plurality of semiconductor packages, the plurality of semiconductor packages including a plurality of component dies, includes a test chamber including a securing assembly at a bottom thereof, the securing assembly configured to secure the plurality of the semiconductor packages to the securing assembly. The test apparatus may include an operation tester in the test chamber. The operation tester may be configured to conduct an operation test to the plurality of semiconductor packages to detect whether at least one semiconductor package of the plurality of semiconductor packages is an operation fault package having a fault, and identify a fault package point at which the operation fault package is located in the plurality of semiconductor packages in response to detecting the operation fault package. The test apparatus may include a fault heat detector in the test chamber. The fault heat detector may be configured to detect fault heat generated from the operation fault package. The test apparatus may include a test controller at an outside of the test chamber. The test controller may be configured to control the operation tester to conduct the operation test to the plurality of semiconductor packages and control the fault heat detector subsequent to the operation test to detect the fault heat generated from the fault of the operation fault package to determine a vertical point of the fault and to determine a fault die having the fault.

According to some example embodiments of the inventive concepts, a manufacturing system for manufacturing semiconductor packages may include a die bonding apparatus configured to bond a plurality of component dies to each chip on a wafer to manufacture a plurality of semiconductor packages on the wafer, a package test apparatus configured to enable an operation test and fault heat detection to be performed sequentially and continuously on the plurality of semiconductor packages without chamber exchange, the operation test performed to detect whether at least one semiconductor package of the plurality of semiconductor packages is an operation fault package having a fault, the fault heat detection including detecting a vertical point of the fault in the operation fault package, and a package transfer apparatus configured to transfer the wafer on which the plurality of the semiconductor packages are located to the package test apparatus from the die bonding apparatus.

According to some example embodiments of the inventive concepts, a method of manufacturing a semiconductor package may include manufacturing a plurality of semiconductor packages by bonding a plurality of component dies on a buffer substrate in a die bonding apparatus, loading the buffer substrate on which the plurality of semiconductor packages are located into a package test apparatus, performing an operation test on all semiconductor packages of the plurality of semiconductor packages to detect whether at least one semiconductor package of the plurality of semiconductor packages is an operation fault package having a fault, and respond to detection of the operation fault package in the plurality of semiconductor packages by generating a fault map that indicates a position of the operation fault package in the plurality of semiconductor packages, performing a fault detection process on the operation fault package continuously with the operation test to determine a vertical point of the fault in the operation fault package, and determining a component die having the fault as a fault die in the operation fault package, and selecting die information of the fault die from a die database and transferring the die information to the die bonding apparatus.

According to example embodiments of the present inventive concepts, the position of the operation fault package and the vertical point or the fault position of the fault may be sequentially and continuously obtained in a single test chamber. The heat sensor may be provided in the test chamber in which the operation test may be conducted, so that the fault heat may be detected instantaneously after the operation test. Then, the fault position, the fault die and the die information of the fault die may be obtained by the test controller in a short time after the completion of the die bonding process for manufacturing the chip stack package or the die stack package.

The vertical point of the fault may be calculated as a ratio of the actual heat transfer coefficient with respect to the heat transfer coefficient of the component dies of the operation fault package and the stack position of the fault die in the operation fault package may be selected as a rounding up integer just over the vertical point.

The die information of the fault die may be transferred to the die bonding apparatus in a relatively short time after the die bonding process, and thus the fault of the semiconductor packages may be rapidly prevented in a subsequent die bonding process, to thereby increase the reliability and the process efficiency of the die bonding process.

BRIEF DESCRIPTION OF THE DRAWINGS

These and other features of the inventive concepts will become more apparent by describing in detail some example embodiments thereof with reference to the accompanying drawings of which:

FIG. 10 is a block diagram showing a process step for obtaining the 3-dimensional fault position shown In FIG. 9.

DETAILED DESCRIPTION

Figure 1:
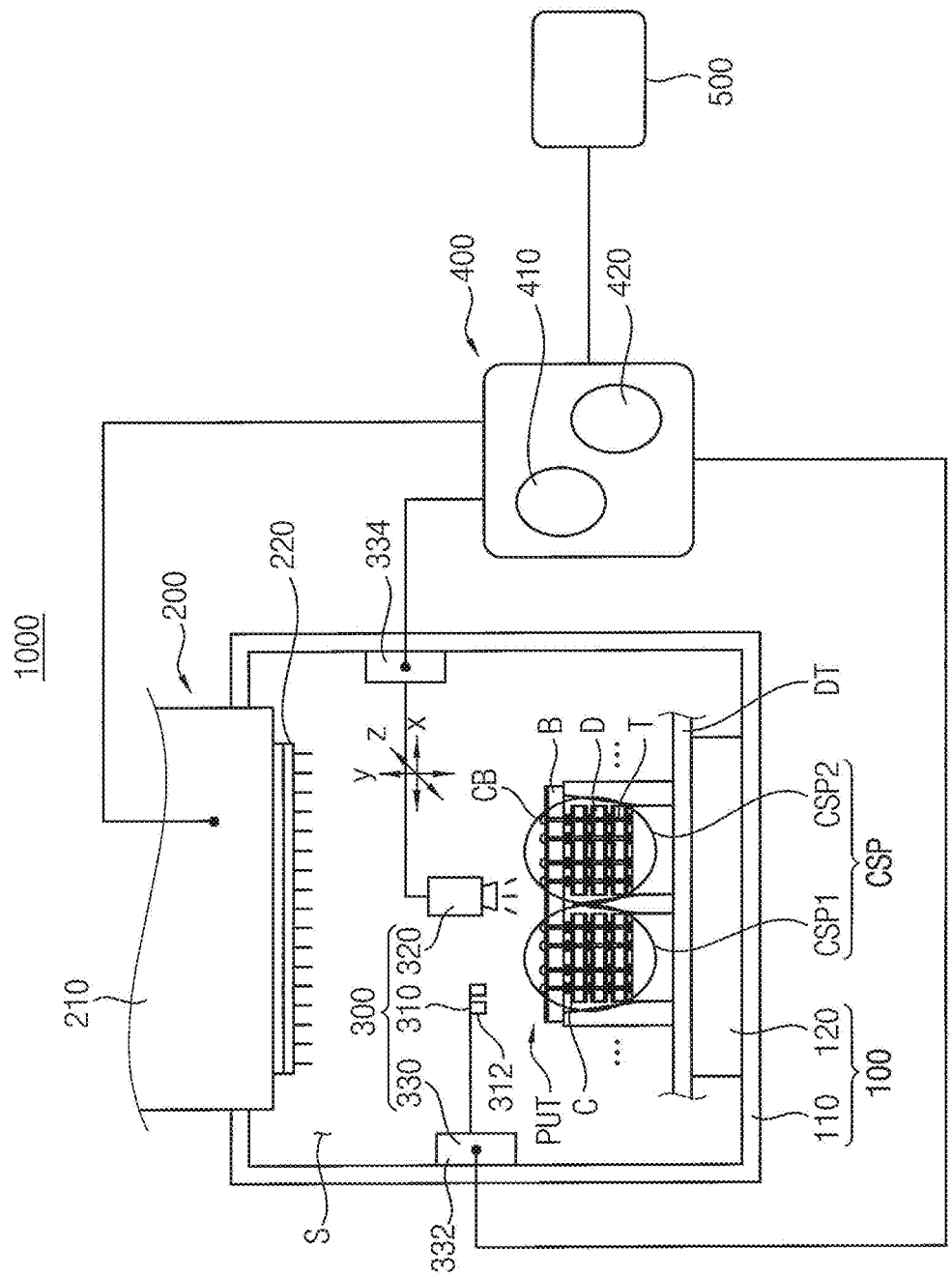
FIG. 1 is a structural view illustrating a test apparatus for testing semiconductor packages in accordance with some example embodiments of the present inventive concepts.

Reference will now be made to some example embodiments, which are illustrated in the accompanying drawings, wherein like reference numerals may refer to like components throughout.

FIG. 1 is a structural view illustrating a test apparatus for testing semiconductor packages in accordance with some example embodiments of the present inventive concepts.

Referring to FIG. 1, a test apparatus 1000 for testing semiconductor packages in accordance with some example embodiments of the present inventive concepts may include a test chamber 100 including a securing assembly 120 at a bottom thereof in such a configuration that a plurality of the semiconductor packages under test PUT nay be secured to the securing assembly 120 and each of the semiconductor packages PUT may include a plurality of component dies D, an operation tester 200 arranged in the test chamber 100 and configured to conduct an operation test to each of the semiconductor packages PUT in such a configuration that the operation tester is configured to detect at least a non-operating semiconductor package NOP in response to the operation test as an operation fault package OFP with a fault package point FPP, a fault heat detector 300 arranged in the test chamber 100 and configured to detect a fault heat H from (e.g., generated from) the operation fault package OFP having a fault F therein (e.g., the fault heat detector 300 may detect fault heat H generated from the fault F of the operation fault package OFP, for example in response to the operation test performed by the operation tester 200), and a test controller 400 arranged at an outside of the test chamber 100 and controlling the fault heat detector 300 to detect the fault heat H after (e.g., in response to) the operation test and determining a vertical point VP of the fault F and a fault die FD having the fault F in the operation fault package OFP. The fault F in the operation fault package OFP may be interchangeably referred to herein as an inner fault of the operation fault package OFP.

For example, the test chamber 100 may include a housing 110 having a test space S therein and the securing assembly 120 to which the semiconductor packages under test PUT may be secured. Restated, the securing assembly 120 may be configured to secure the semiconductor packages under test PUT within the test space S of the test chamber. The securing assembly 120 may be, for example a clamp, configured to secure semiconductor packages to itself. The operation test and the fault detection for finding a fault die may be conducted to the semiconductor packages PUT, so the semiconductor packages PUT may be ready for a sequential and continuous process of the operation test and the fault detection in the test chamber 100. For those reasons, all the semiconductor packages on the securing assembly 120 are denoted as a reference mark of PUT indicating semiconductor packages under test. As described in detail hereinafter, the semiconductor packages PUT may be sorted into operating packages OP and non-operating packages NOP as a result of the operating test. The non-operating semiconductor packages NOP may be classified to the operation fault packages OFP and the fault detection process may be continuously conducted to the operation fault packages OFP in the same test chamber 100.

The test space S of the housing 110 may be sufficiently large to conduct the operation test and the fault detection and may be shaped into a 3-dimensional cubic shape having a width, a length and a height in a first direction x, a second direction y and a third direction z, respectively. The housing 110 may have various sizes and shapes as long as the test and the fault detection may be sufficiently conducted in the housing 110.

In some example embodiments, the housing 110 may have sufficient rigidity and stiffness for the installation of a driver 330 which is described in detail hereinafter, and may include a stainless steel-frame structure.

The securing assembly 120 may be provided with a bottom of the housing 110 and the semiconductor packages PUT may be secured to the securing assembly 120. The securing assembly 120 may include a securing plate (not shown) to which the semiconductor packages PUT may be secured and an adjuster (not shown) for linearly moving the securing plate in the first, the second and the third directions x, y and z and rotating the securing plate with respect to the third direction z.

When the semiconductor packages PUT may be secured to the securing assembly 120, the position of the semiconductor packages PUT may be adjusted in view of the operation test. In some example embodiments, the fault detection may be conducted based on the package positions that may be determined for the operation test.

For example, when an electrical die sorting (EDS) process may be conducted to the semiconductor packages PUT as the operation test, the securing assembly 120 may be controlled in such a way that the semiconductor package PUT may be aligned with a probe structure. Accordingly, it will be understood that the test chamber 100 may include a chamber structure configured to conduct an EDS process to the semiconductor packages PUT.

For another example, when a burn-in test may be conducted to the semiconductor packages PUT under extreme situations as the operation test, the securing assembly 120 may be controlled in such a way that the semiconductor package PUT may be sufficiently contact with contact probes. In such a case, the securing assembly 120 may be provided as a socket in which the semiconductor packages PUT may be received.

The test chamber 100 may be varied according to the test process. For example, the test chamber 100 may include an electrical die sorting (EDS) chamber in which electrical shorts of the semiconductor packages PUT may be tested. In addition, the test chamber 100 may include a monitoring burn-in test chamber 250 (e.g., including a monitoring burn-in test apparatus) in which the operation characteristics of the semiconductor packages PUT may be tested, e.g., based on the DC current test being performed, for example by DC current test terminal 240, under extreme situations such as an extremely high or low temperature and pressure.

Each of the semiconductor packages PUT may include various substrate level packages in which a plurality of component dies D may be stacked on a buffer substrate B. A plurality of the component dies D may be stacked into a stack structure and a plurality of the stack structures may be arranged on the buffer substrate B. When each of the component dies D may be electrically interconnected by a penetration electrode T, the semiconductor packages PUT may be configured into a die stack package (DSP) or a chip stack package (CSP). Accordingly, the semiconductor packages PUT may include at least one of chip stack packages (CSP) in which a plurality of component dies D is stacked on each chip on a wafer or a die stack package (DSP) in which a plurality of component dies D is stacked on each stack area of an interposer.

In FIG. 1, a pair of the stack structures is arranged on the buffer substrate B and thus a pair of the substrate level packages is illustrated for conveniences' sake. However, a plurality of the stack structures may be arranged on a whole surface of the buffer substrate B, and thus a plurality of the substrate level packages may be arranged in the test chamber 100. The substrate level package may be configured into a chip stack package CSP or a die stack package DSP.

In some example embodiments, the buffer substrate B may include a wafer on which a plurality of chips C may be arranged. When a plurality of the component dies D may be arranged on each chip of the wafer, the chip C of the wafer and the plurality of the component dies D stacked on the chip C may be configured into the chip stack package CSP as the semiconductor package PUT. The component dies D and the chip C may be electrically connected with each other by the penetration electrode T such as a through-silicon via (TSV).

A plurality of the chips C may be formed on the wafer by the conventional semiconductor manufacturing processes and the wafer having the chips C itself may be loaded into a bonding chamber of a die boding apparatus. Then, a number of the component dies D may be repeatedly stacked on each chip C of the wafer in the die bonding apparatus. Therefore, a plurality of the chip stack packages CSP may be arranged on the wafer as many as the chips C.

For example, a plurality of DRAM chips may be arranged on the wafer and a plurality of DRAM dies may stacked on each DRAM chip on the wafer, thereby forming a plurality of DRAM die stack packages just like a high bandwidth memory (HBM) that is a high speed and high capacity memory system for a graphic card.

The wafer on which a plurality of the semiconductor packages PUT may be arranged may be loaded into the test chamber 100 and the operation test and the fault detection may be sequentially conducted to the semiconductor packages PUT.

In some example embodiments, the buffer substrate B may include an interposer. The interposer may include a plurality of stack areas that may be arranged in a matrix shape on an upper surface and a plurality of the component dies D may be stacked on each stack area. The plurality of the component dies D stacked on each stack area may be configured into the die stack package DSP as the semiconductor package PUT. That is, a plurality of the semiconductor packages PUT may be arranged on the interposer as many as the number of the stack areas. The interposer may function as an intervening member between the die stack package DSP and a neighboring system.

For example, a graphic card for a computer system may include a main board to which various collateral devices such as a cooler and an interposer that may be connected to the main board. In such a case, essential devices for the graphic card such as a graphic control unit (GPU) and a graphic memory device may be arranged on the interposer. Particularly, the graphic memory device may include the die stack package DSP that may be stacked on the interposer. Otherwise, the die stack package DSP may also be manufactured by an additional process and may be mounted on the interposer.

The buffer substrate B on which the semiconductor packages PUT may be arranged may be loaded into the test chamber 100 from a die bonding apparatus and may be secured to the securing assembly 120. Thus, the operation test and the fault detection may be conducted to the semiconductor packages PUT in the same test chamber 100. A plurality of contact bumps CB may be arranged on a rear surface of the buffer substrate B and the semiconductor packages PUT may be communicated with surroundings through the contact bumps CB.

Particularly, the semiconductor packages PUT may be secured to the securing assembly 120 in such a way that the contact bumps CB may face an upper portion of the test chamber 100 and an uppermost component die may face the securing assembly 120. Thus, the operation tester 200 may be installed to the upper portion of the test chamber 100 and the test signals may be applied to the contact bumps CB from the operation tester 200.

When the chip stack package CSP may be loaded into the test chamber 100, a dicing tape DT under the wafer may also be secured to the securing assembly 120. Thus, the operation test and the fault detection may be conducted prior to a dicing process for separating the whole chip stack packages on the wafer into individual chip stack packages.

In such a case, the dicing tape DT need be adhered to the wafer and may be interposed between the securing assembly 120 and the semiconductor packages PUT in the test chamber 100. The chip stack package CSP may be separated into individual chip stack packages CSP by using the dicing tape DT after the operation test and the fault detection.

A test signal may be applied to each of the semiconductor packages PUT by the operation tester 200 and the operation characteristics of each semiconductor package PUT may be inspected by the operation tester 200. Each (e.g., any) fail semiconductor package PUT, which is determined by the operation tester 200 to fail the operation test, may be sorted into (e.g., classified as) an operation fault package OFP, and a corresponding 2-dimensional position (e.g., fault position FPP) of each operation fault package in the semiconductor packages PUT may be identified. Restated, the operation tester 200 may be configured to emit a test signal that is applied to each of the semiconductor packages PUT and may inspect operation characteristics of each semiconductor package PUT based on receiving operation signals generated at the semiconductor packages PUT in response to the test signal, such that the operation tester 200 may determine whether at least one semiconductor package PUT is an operation fault package OFP having a fault at a fault package point FPP of the semiconductor packages PUT based on inspecting the operation characteristics of the at least one semiconductor package PUT in response to the test signal, for example failing to emit an operation signal in response to the test signal, emitting a fail signal, or the like. Accordingly, the operation tester 200 may conduct an operation test to the plurality of semiconductor packages PUT to detect, based on the operation test, whether the plurality of semiconductor packages PUT includes an operation fault package OFP having a fault, and to identify a fault package point FPP indicating a 2-dimensional location at which each detected operation fault package OFP is located in the plurality of semiconductor packages PUT.

For example, the operation tester 200 may include a test head 210 and a probe assembly 220 when an EDS process may be conducted to the semiconductor packages PUT. The test head 210 may be installed (e.g., positioned) at an upper portion of the test chamber 100 and a test signal may be transferred to the semiconductor packages PUT under the control of a fault package controller 410 that may be described in detail hereinafter. Restated, the test head 210 may be configured to transfer the test signal to each semiconductor package of the plurality of semiconductor packages PUT. The probe assembly 220 may include a plurality of test probes 221 movably secured to the test head 210. The test probes 221 may make selectively contact with separate, respective semiconductor packages of the semiconductor packages PUT and may be configured to thereby simultaneously apply the test signal to the semiconductor packages PUT. In some example embodiments, the test head 210 may be referred to as being part of the probe assembly 220.

The test head 210 may be electrically connected to the fault package controller 410. Thus, the test signal may be applied to each semiconductor package PUT from the test head 210 (e.g., via the test probes 221) and an operation signal may be generated from each semiconductor package PUT and be transferred to the test head 210. As a result of the operation test, the semiconductor packages PUT may be classified into (e.g., detected to be) operating packages OP in FIG. 3 from which a normal operation signal is generated in response to the test signal and non-operating packages NOP in FIG. 3 from which a bad or fail operation signal is generated in response to the test signal.

The probe assembly 220 may apply the test signal to the contact bump CB of each semiconductor package PUT via the test probe 221 that may be contact with the contact bump CB.

Figure 2A:
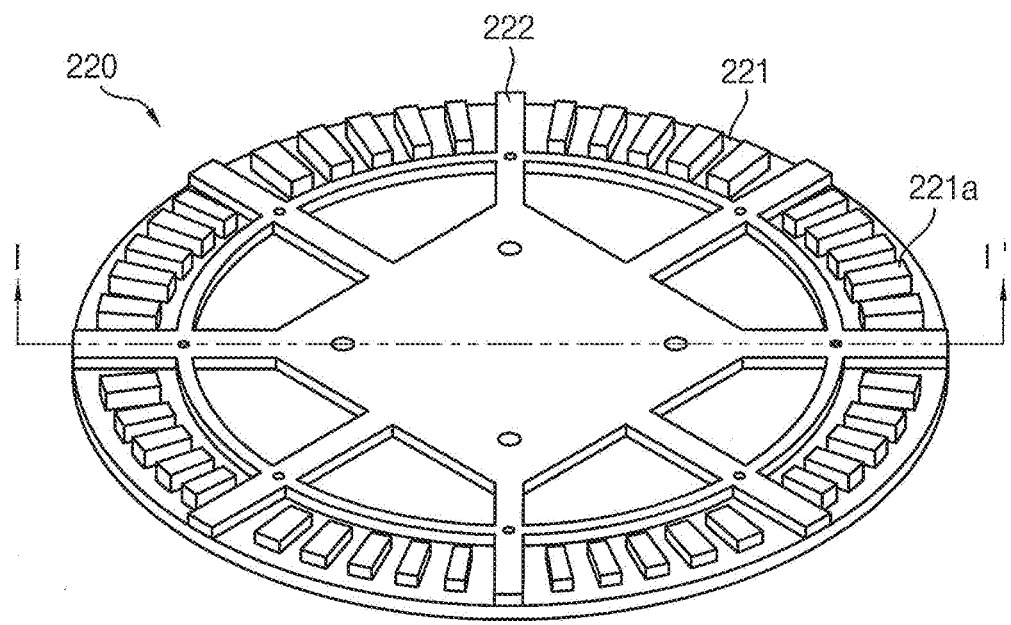
FIG. 2A is a perspective view illustrating a probe assembly as some example embodiments of the operation tester in FIG. 1.
Figure 2B:
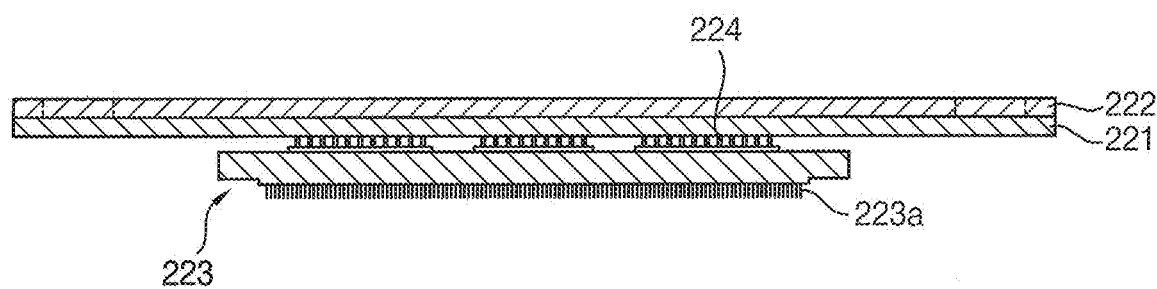
FIG. 2B is a cross-sectional view of the probe assembly cut along a line I-I' of FIG. 2A.

FIG. 2A is a perspective view illustrating a probe assembly in some example embodiments of the operation tester in FIG. 1, and FIG. 2B is a cross-sectional view of the probe assembly cut along a line I-I' of FIG. 2A.

Referring to FIGS. 2A and 2B, the probe assembly 220 may include a disk-shaped probe board (e.g., test probes 221) in which electric circuits may be arranged, a reinforce member 222 for preventing the deformation of the probe board (e.g., test probes 221), a plurality of probe blocks 223 arranged on a lower surface of the probe board (e.g., test probes 221) and an interposer 224. Each of the probe blocks may be shaped into a rod having a length sufficiently covering a whole row or a whole column of the semiconductor packages PUT.

A plurality of connector pieces 221a may be arranged on an upper surface of the probe board (e.g., test probes 221) at the same gap distance along a circumferential line of a peripheral portion, and a plurality of probes 223a may be arranged on a lower surface of the probe block 223. The probes 223a may make contact with the contact bump CB of each semiconductor package PUT.

The semiconductor packages PUT may be aligned with a plurality of the probe blocks 223 by the movement of the securing assembly 120, and then the probe assembly 220 may move downwards in such a way that each probe 223a may make contact with the corresponding contact bump CB.

The test signal may be applied to the contact bump CB of the semiconductor package PUT by the test head 210 and the operation signal may be transferred to the test head 210. The test head 210 may analyze the operation signal of each semiconductor package PUT and may classify the semiconductor packages PUT into the operating packages OP and the non-operating packages NOP (e.g., may detect whether one or more of the semiconductor packages PUT is an operating package OP or a non-operating packages NOP). Particularly, a package map may be provided with the test head 210 in such a way that the positions of every semiconductor package PUT may be individually indicated by the operation tester 200 on the package map. In such a case, the package map may be modified into a fault map on which only the non-operating packages NOP may be indicated.

The test signal may be varied in accordance with inspection items to the semiconductor packages PUT. When the test signal may be applied to the contact bump CB, the semiconductor package PUT may work in response to the test signal and the work state of the semiconductor package PUT may be transferred to the test head 210 as the operation signal. The non-operating packages NOP may have something faults such as a materials defect, e.g., cracks and an operation defect, e.g. electric shorts. For that reason, the non-operating packages NOP may be referred to as operation fault package OFP in FIG. 6.

Figure 3:
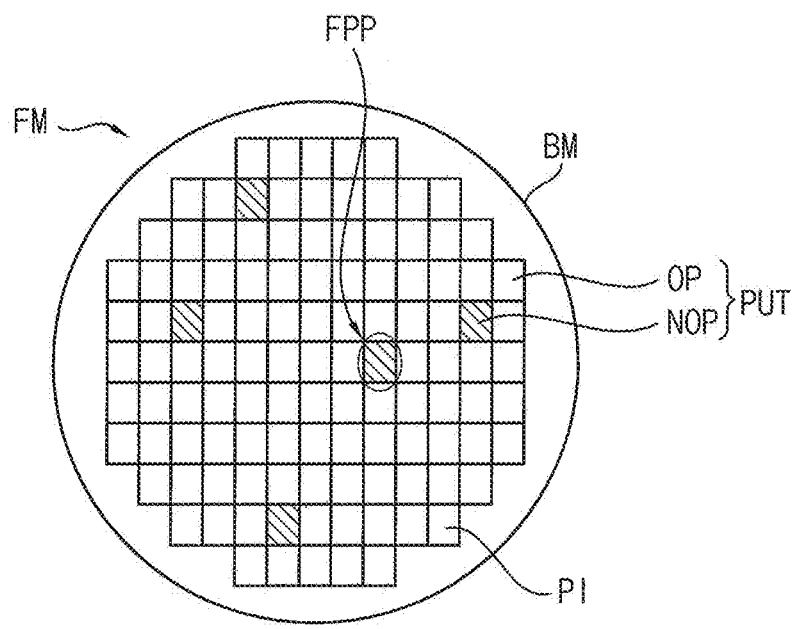
FIG. 3 is a view illustrating the fault map indicating the results of the operation test by the operation tester shown in FIG. 1.

FIG. 3 is a view illustrating the fault map indicating the results of the operation test by the operation tester 200 shown in FIG. 1.

Referring to FIG. 3, the fault map FM may include a base map BM indicating a planar shape of the buffer substrate B and a plurality of package images PI corresponding to the semiconductor packages PUT, respectively, on the base map BM.

The base map BM may be selected by the test head 210 in accordance with the shape of the buffer substrate B and the package images PI may be provided as an image group that may be varied in accordance with the stack characteristics of the component dies D. A 2-dimensional package point may be allocated to each of the package images PI corresponding to the semiconductor packages PUT on the buffer substrate B. That is, the semiconductor package PUT on the buffer substrate B may be uniquely designated by the package image PI on the base map BM at the package point.

A plurality of visual fault indicators may be marked at the positions of the package images PI corresponding to the operation fault packages OFP, so a plurality of the operation fault packages OFP may be visually shown on the fault map FM. The positions of the package images PI corresponding to the operation fault packages OFP may be designated by 2-dimensional coordinates on the fault map FM, and the position of the operation fault package OFP may be detected as the fault package point FPP.

Accordingly, the distribution of the operation fault packages OFP may be overviewed on the fault map FM with the positions of the operation fault packages OFP. The test head 210 may detect and store the fault package point FPP with reference to a x-y plane coordinate system on the fault map FM.

In some example embodiments, the operation tester 200 may include a direct current (DC) test terminal 240 in a monitoring burn-in test chamber 250.

Figure 4:
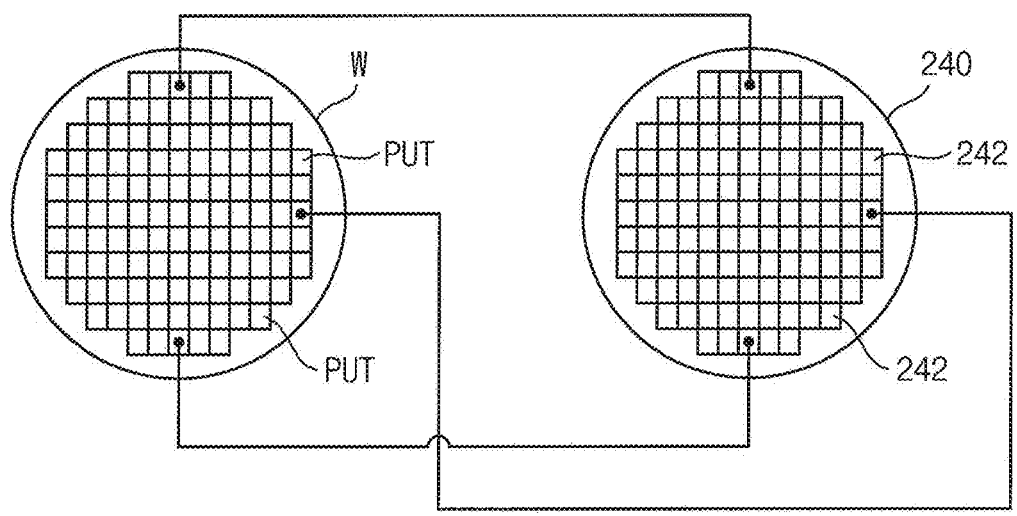
FIG. 4 is a view illustrating a test terminal of a monitoring burn-in test (MBT) apparatus as some example embodiments of the operation tester in FIG. 1.

FIG. 4 is a view illustrating a test terminal of a monitoring burn-in test (MBT) apparatus as some example embodiments of the operation tester in FIG. 1. In FIG. 4, the test chamber 100 may be provided as the MBT chamber and a direct current (DC) test terminal may be, in some example embodiments, provided with the test chamber 100.

Referring to FIG. 4, the semiconductor packages PUT may be secured on the securing assembly 120 for the MBT. The DC current test terminal may be installed at the upper portion of the test chamber 100 and be shaped into the same shape as the buffer substrate B holding the semiconductor packages PUT. The DC current test may be individually conducted to each of the semiconductor packages PUT in the test chamber 100.

For example, the DC current test terminal 240 (also referred to herein as a DC current test terminal) may be located at an upper portion of the test chamber 100 and may include a disk-shaped terminal at which a plurality of test tips 242 may be arranged correspondently to the semiconductor packages PUT by one to one. Thus, when the DC test may be initiated in the MBT chamber, the DC test terminal may move downwards until each test tip 242 may make contact with the contact bump CB of the corresponding semiconductor package PUT.

While some example embodiments disclose that 3 test tips 242 are provided with the DC current test terminal 240 and thus 3 semiconductor packages PUT experience the DC test, any other number of the test tips 242 may also be provided with the DC current test terminal 240. For example, the test tips 242 may be provided as many as the number of the semiconductor packages PUT.

The semiconductor packages PUT may be classified into the operating packages OP and the operation fault packages OFP based on the DC test and the operation fault packages OFP may also be marked on the fault map shown in FIG. 3. Thus, the positions of the operation fault packages OFP may be designated by 2-dimensional coordinates on the fault map FM, and the position of the operation fault package OFP may be detected as the fault package point FPP.

In some example embodiments, the fault heat detector 300 may be provided with (e.g., located within) the test chamber 100 together with the operation tester 200, so the fault detection may be continuously conducted to the semiconductor packages PUT immediately after the operation test. Thus, the operation test and the fault detection may be sequentially and continuously conducted to the semiconductor packages PUT in the test chamber 100.

For example, the fault heat detector 300 may include a signal unit 310 (also referred to herein as a signal emitter) applying (e.g., configured to apply) a detection signal to the operation fault package OFP (e.g., emit a detection signal to the operation fault package OFP), a heat sensor 320 detecting (e.g., configured to detect) a fault heat H generated from a fault (e.g., fault F) of the operation fault package OFP (also referred to herein as an inner fault of the operation fault package OFP) in response to the detection signal, and a driver 330 disposed (e.g., located) in the test chamber 100 and communicatively coupled (e.g., installed) to the signal unit 310 and the heat sensor 320) such that the driver 330 is configured to drive the signal unit 310 and the heat sensor 320 to move to the operation fault package OFP (e.g., configured to be moved to be positioned over a detected operation fault package OFP, configured to be moved to vertically overlap the operation fault package OFP in the Y-direction, etc.). The fault heat H may flow upwards or downwards from the fault F and may be detected by the heat sensor 320. For example, the heat sensor 320 may be configured to detect the fault heat H from a surface (e.g., an upper surface) of the operation fault package OFP to which the fault heat H flows from the fault F.

In some example embodiments, the driver 330 may include a first driver 332 and a second driver 334 that may be installed at an inner side of the test chamber 100. The signal unit 310 may be secured to the first driver 332 and may move according to the movement of the first driver 332. In the same way, the heat sensor 320 may be secured to the second driver 334 and may move according to the movement of the second driver 334.

The signal unit 310 may move in the first direction x, the second direction y and the third direction z, respectively, over the semiconductor packages PUT in the test chamber 100. For example, the signal unit 310 may include a contact probe 312 that may make contact with the contact bump CB of the operation fault package OFP and may apply the detection signal to the operation fault package OFP.

When an electric signal may be applied to the contact bump CB of the operation fault package OFP as the detection signal, a resistive heat such as a Joule heat may be generated from the fault F of the operation fault package OFP and thus the fault F may function as a heat source of the resistive heat. In such a case, the resistive heat may function as the fault heat H. Accordingly, it will be understood that the fault heat H may include a resistive heat generated from the fault in response to the detection signal applied by the signal unit 310.

In addition, the heat sensor 320 may move in the first direction x, the second direction y and the third direction z, respectively, over the semiconductor packages PUT or under the semiconductor package PUT in the test chamber 100. When the detection signal may be applied to the operation fault package OFP, the signal unit 310 may be removed from operation fault package OFP, and the heat sensor 320 may move over the operation fault package OFP. The fault heat H may be transferred to a top surface or a bottom surface of the operation fault package OFP and may be detected by the heat sensor 320. In some example embodiments, the heat sensor 320 may include a thermal imaging camera (e.g., an infrared camera). The thermal imaging camera may be configured to detect the resistive heat at at least one position of a position over the operation fault package OFP or a position below the operation fault package OFP (e.g., a position overlapping the operation fault package OFP in the vertical direction (e.g., the Y-direction)).

Since making contact with the contact bump CB of the semiconductor packages PUT, the signal unit 310 may be positioned over the semiconductor packages PUT. In contrast, the heat sensor 320 may be positioned under (e.g., beneath) the semiconductor packages PUT (e.g., an operation fault package OFP) as well as, or alternatively, over (e.g., above) the semiconductor packages PUT (e.g., an operation fault package OFP), as long as the fault heat H may be sufficiently detected by the heat sensor 320.

Figure 5:
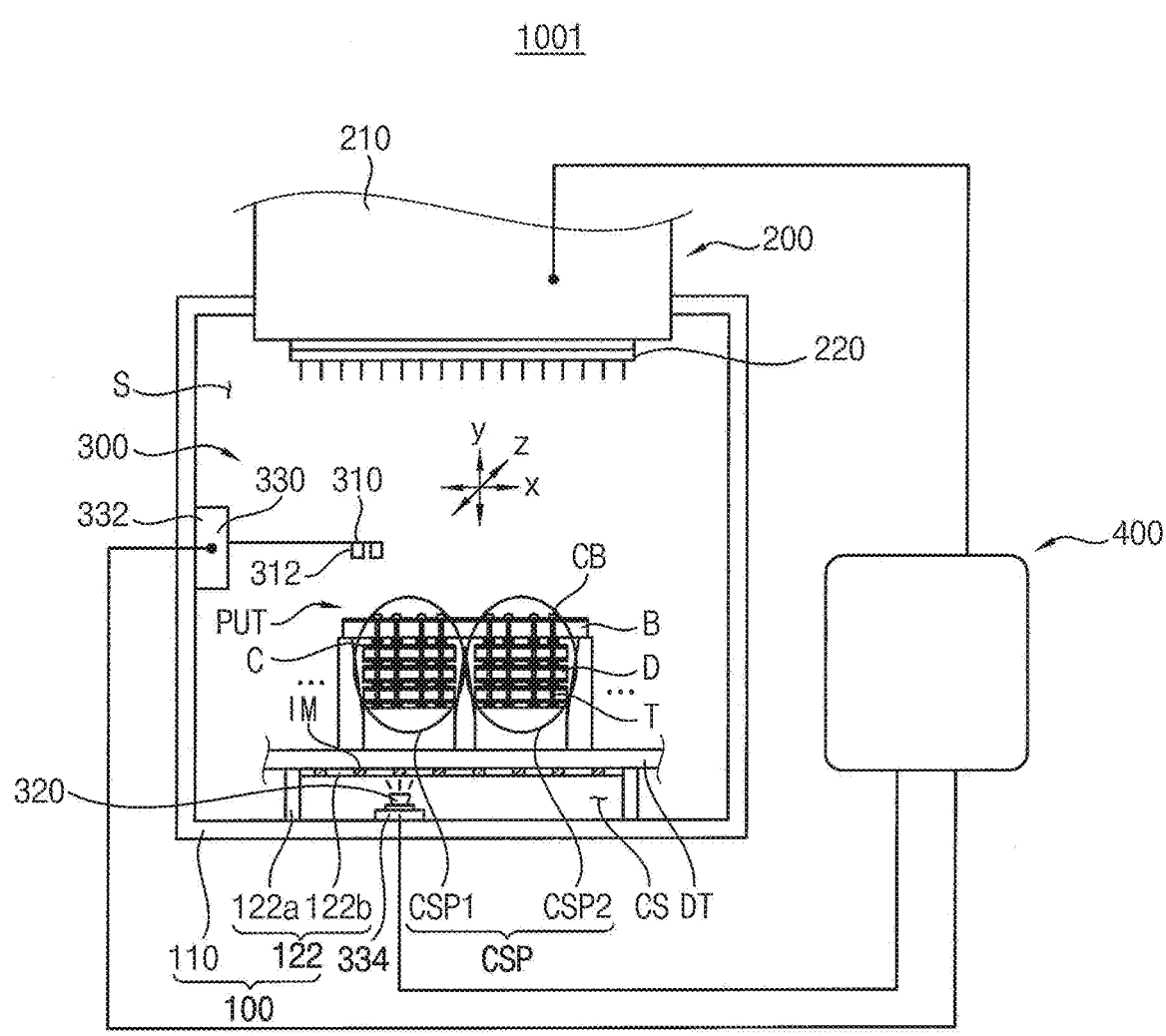
FIG. 5 is a structural view illustrating a modification of the test apparatus for testing semiconductor packages shown in FIG. 1.

FIG. 5 is a structural view illustrating a modification of the test apparatus for testing semiconductor packages shown in FIG. 1. In FIG. 5, a modified test apparatus 1001 may have substantially the same structures as the test apparatus 1000 except that the heat sensor 320 may be arranged in a modified securing assembly 122.

Referring to FIG. 5, the securing assembly 120 of the test apparatus 1000 may be modified into a modified securing assembly 122 shaped into a reverse cylinder having a support plate 122b and a cylinder wall 122a. The plurality of semiconductor packages PUT may be secured on the support plate 122b.

The support plate 122b may be shaped into a disk corresponding to the semiconductor package PUT and may comprise a material having high thermal conductivity. Particularly, a plurality of location marks IM for indicating the positions of the semiconductor packages PUT may be arranged on a lower surface of the support plate 122b, wherein the location marks correspond to separate, respective semiconductor packages PUT and thus the fault package point FPP may be accurately detected by the heat sensor 320 under the operation fault package OFP. Thus, the fault heat H may be sufficiently well detected at the lower portion of the operation fault package OFP.

The cylinder wall 122a may extend downwards from the support plate 122b just like a hollow shaft (e.g., shaped into a hollow shaft) defining a central space CS at a central portion. Thus, the lower surface of the support plate 122b may be exposed to the central space CS and the heat sensor 320 may be positioned in the central space CS of the cylinder wall 122a beneath the support plate 122b.

In such a case, the second driver 334 may be positioned at a bottom of the test chamber 100 in the central spaced CS and the heat sensor 320 may be secured to the second driver 334. The second driver 334 may move horizontally with reference to the location marks in the central space CS, and thus the heat sensor 320 may be positioned under the operation fault package OFP according to the location mark corresponding to the operation fault package OFP. Therefore, the fault heat H may be detected by the heat sensor 320 under the operation fault package OFP.

In some example embodiments, the test controller 400 may be positioned at an outside of the test chamber 100 and may control the operation tester 200 and the fault heat detector 300 in such a way that the fault package point FPP and the vertical point VP of the fault F may be sequentially and continuously detected (e.g., determined) in the same test chamber 100. Thus, a 3-dimensional fault position FP may be determined from the fault package point FPP and the vertical point VP of the fault F and the component die D positioned at the fault position FP may be detected as the fault die FD. Accordingly, the test controller 400 may control the operation tester 200 and the fault heat detector to detect the fault heat H subsequent to the conducting of the operation test associated with the operation tester 200, to determine the vertical point VP of the fault F of an operation fault package OFP detected based on the operation test and to determine a fault die FD having (e.g., including) the fault F.

For example, the test controller 400 may include a fault package controller 410 controlling (e.g., configured to control) the operation tester 200 to detect one or more operation fault packages OFP and to generate the fault map FM on which the fault package point FPP of each operation fault package OFP may be marked and a fault position controller 420 controlling (e.g., configured to control) the fault heat detector 300 to detect the fault heat H and to determine the fault position FP and a fault die FD in the operation fault package OFP.

In some example embodiments, some or all of any element of the test apparatus 1000 as described herein, including the operation tester 200 according to any of some example embodiments, the fault heat detector 300 according to any of some example embodiments, the test controller 400 according to any of some example embodiments, including some or all of the fault package controller 410 and the fault position controller 420, any combination thereof, or the like may include, may be included in, and/or may be implemented by one or more instances (e.g., articles, pieces, units, etc.) of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, or memory, for example a solid state drive (SSD), storing a program of instructions, and a processor configured to execute the program of instructions to implement the functionality of some or all of the operation tester 200, the fault heat detector 300, the test controller 400, any combination thereof, or the like. It will be understood that, as described herein, an element (e.g., processing circuitry, digital circuits, etc.) that is described as "implementing" an element (e.g., operation tester 200, fault heat detector 300, fault package controller 410, fault position controller 420, etc.) will be understood to implement the functionality of said implemented element (e.g., the functionality of operation tester 200, the functionality of fault heat detector 300, the functionality of fault package controller 410, the functionality of fault position controller 420, etc.). In some example embodiments the test controller 400 may implement at least some of the functionality of the operation tester 200 and/or the fault heat detector 300 as described herein. In some example embodiments, the operations described herein may be implemented by one or more elements of the test apparatus, including the operation tester 200, the fault heat detector 300, and/or the test controller 400.

The fault package controller 410 may generate a first initial signal for initiating (e.g., to initiate) the operation test and the test head 210 may apply the test signal to the probe assembly 220 or the DC current test terminal 240 in response to the first initial signal. The operation signal generated from the semiconductor packages PUT in response to the test signal may be transferred again to the test head 210 and the operation signals may be analyzed in the test head 210.

According to the analysis results of operation test, the semiconductor packages PUT may be sorted into (e.g., detected to be) the normal operating packages OP and the non-operating packages NOP (e.g., one or more semiconductor packages PUT may be detected to be normal operating package OP or a non-operating package NOP based on the operation test). Particularly, the non-operating packages NOP may be stored as (e.g., detected as) the operation fault packages OFP and the positions of the operation fault packages OFP may be marked on the fault map FM.

The information of the fault map FM may be transferred from the operation tester 200 to and stored in the fault package controller 410.

When the operation test to the semiconductor packages PUT may be completed and the fault map FM on which the operation fault packages OFP may be stored to the fault package controller 410, the fault package controller 410 may generate a second initial signal and the fault position controller 420 may initiate the fault detection by moving the heat sensor 320 over the operation fault package OFP based on the fault map FM. The fault position controller 420 may determine the fault position FP by calculating a vertical point VP of the heat source or the fault F.

The procedure of determining the vertical point VP or the fault position FP will be described in detail hereinafter with references to FIGS. 6 and 7.

Figure 6:
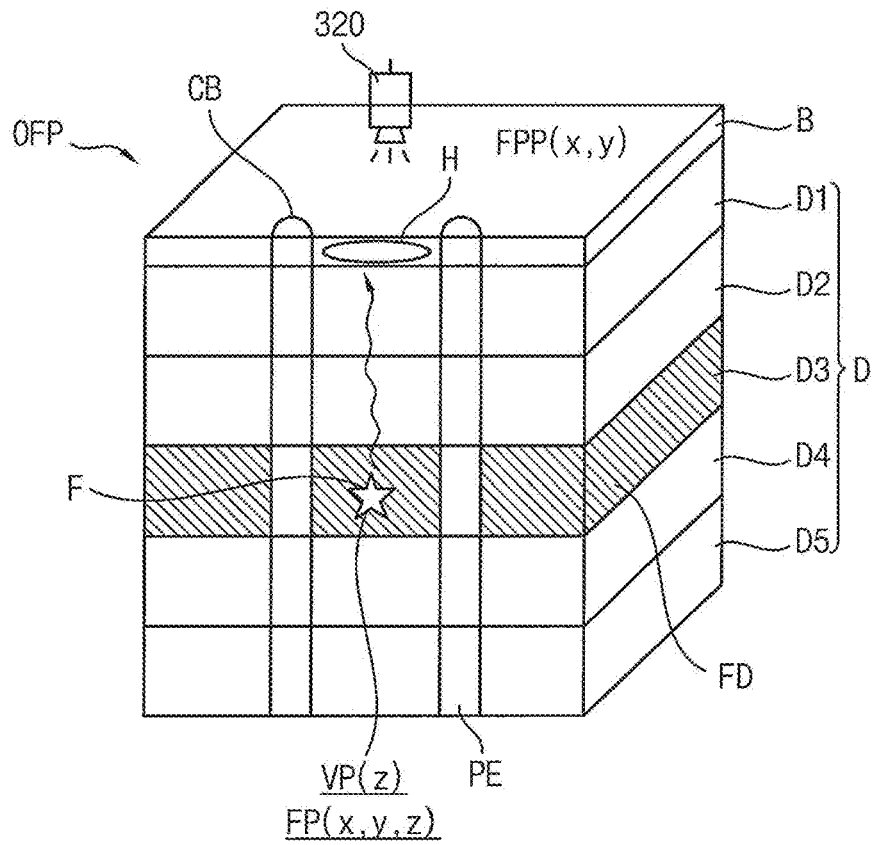
FIG. 6 is a perspective view illustrating the operation fault package having the fault in accordance with some example embodiments of the present inventive concepts.
Figure 7:
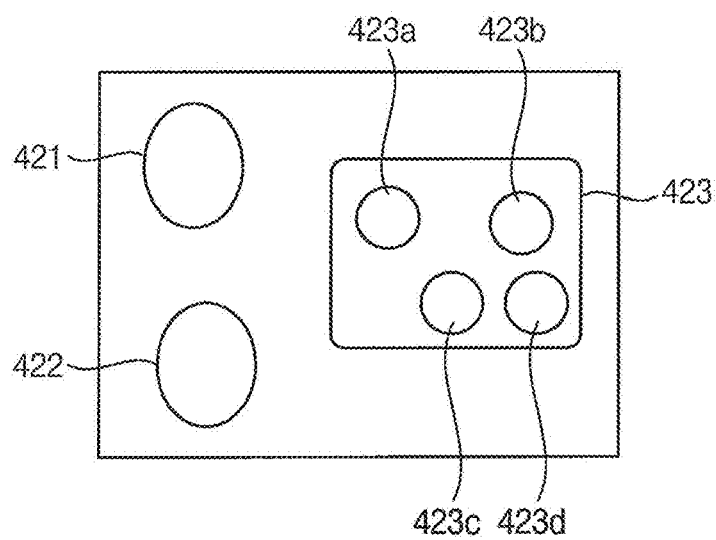
FIG. 7 is a block diagram showing the configurations of the fault position controller of the test controller shown in FIG. 1.

FIG. 6 is a perspective view illustrating the operation fault package having the fault in accordance with some example embodiments of the present inventive concepts, and FIG. 7 is a block diagram showing the configurations of the fault position controller of the test controller shown in FIG. 1. In FIG. 6, the heat sensor 320 is, in some example embodiments, positioned over a detected operation fault package OFP. However, the heat sensor may also be positioned under the detected operation fault package OFP, as shown in FIG. 5. In addition, the operation fault package OFP in FIG. 6 may include the chip stack package in which a plurality of the component dies D may be stacked on the chip C of the wafer. However, the operation fault package OFP in FIG. 6 may also include the die stack package (DSP) on the interposer.

Referring to FIGS. 6 and 7, the operation fault package OFP may, in some example embodiments, include the buffer substrate B and first to fifth component dies D1 to D5 that may be stacked on the buffer substrate B. The fault F such as the electric shorts and the cracks is, in some example embodiments, positioned at the third component die D3.

Being manufactured by the same semiconductor manufacturing processes, the chip C of the wafer and the first to fifth component dies D may have substantially the same die characteristics and the thermal characteristics. Thus, the first to fifth component dies D may have the same size and thermal coefficient $\alpha$ in the operation fault package OFP.

The fault position controller 420 may control the signal unit 310 to apply the detection signal to a detected operation fault package OFP, that is detected based on the operation test, when the operation test may be completed (e.g., in response to completion of the operation test conducted by the operation tester 200 and/or test controller 400). The fault heat H may be generated from the fault F of the operation fault package OFP in response to the detection signal and may be transferred to the upper surface of the operation fault package OFP sequentially through the second component die D2, the first component die D1 and the buffer substrate B.

Then, the fault heat H may be radiated from the upper surface of the operation fault package OFP and may be detected by the heat sensor 320. The vertical point VP of the fault F in the operation fault package OFP and the fault die FD having the fault F in the operation fault package OFP may be determined by using the detected amount of the fault heat H and a detection time $\Delta T$, as described in detail hereinafter. Accordingly, it will be understood that the fault position controller 420 may be configured to control the fault heat detector 300 to detect the fault heat H from the fault F and determine the vertical point VP of the fault F and the fault die FD having the fault F in the operation fault package after completing (e.g., in response to one or more results of) the operation test.

Hereinafter, the component dies D through which the fault heat H may be transferred toward the heat sensor 320 is referred to as passing dies between the heat source and the heat sensor 320.

For example, the fault position controller 420 may include a first control console 421, a second control console 422 and a position detector 423. The fault position controller may obtain the fault position FP and select the fault die FD by using the fault position FP and a die database.

The first control console 421 may control (e.g., may be configured to control) the signal unit 310 in response to the second initial signal. Thus, the detection signal may be applied to the operation fault package OFP at a first time T1. Accordingly, it will be understood that the first control console 421 may be configured to control the signal unit 310 to apply the detection signal to the operation fault package at the first time T1. Then, the fault heat H may be generated from the fault F and may be detected by the heat sensor 320. It will be understood that detecting the fault heat H by the heat sensor 320 may include detecting an amount (e.g., magnitude, intensity, etc.) of the fault heat H. Particularly, the second control console 422 may detect a time when the fault heat H may be firstly detected and may store as a second time T2. Accordingly, it will be understood that the second control console 422 may be configured to control the heat sensor 320 to detect the fault heat H from the fault F in the operation fault package OFP at the second time T2.

For example, the first control console 421 and the second control console 422 may be connected with the driver 330 and may control the driver 330 to drive the signal unit 310 and the heat sensor 320.

The position detector 423 may be connected to the first control console 421 and the second control console 422. Thus, the first time T1, the second time T2 and the detected amount Q of the fault heat H may be transferred to the position detector 423.

The position detector 423 may obtain (e.g., determine) the detection time ΔT as the time difference between the first time T1 and the second time T2 and an actual heat transfer coefficient Z as a ratio of the detected amount (Q) of fault heat H with respect to the detection time ΔT. Then, the vertical point VP of the fault H may be determined as a ratio of the actual heat transfer coefficient Z with respect to the heat transfer coefficient(s) α of the component dies D. An integer just below the vertical point VP may indicate a stack number of the component dies D over the fault F toward the heat sensor 320, or the number of component dies D constituting the passing dies.

The vertical point VP of the heat source may indicate a vertical position of the fault F of the operation fault package OFP in the third direction z. Thus, the fault position FP may be pointed by 3-dimensional coordinates determined by the 2-dimensional fault package point (x, y) FPP and the 1-dimensional vertical point (z) VP. Accordingly, it will be understood that the position detector 423 may be configured to determine the vertical point VP by calculating a ratio of the actual heat transfer coefficient Z with respect to heat transfer coefficients α of the component dies D to thereby select a particular component die D that corresponds to the vertical point VP as the fault die FD.

In some example embodiments, the position detector 423 may include a data operator 423a, a position calculator 423b, a die database 423c and a die selector 423d.

The data operator 423a may be connected to the first control console 421 and the second control console 422 and may be configured to obtain the detection time ΔT and the actual heat transfer coefficient Z by data operation. For example, the first time T1 may be called up from first control console 421 and the second time T2 may be called up from second control console 422 by the data operator 423a, and then the time difference between the first time T1 and the second time T2 may be calculated by using a computer algorithm and may be stored as the thermal detection time ΔT in the data operator 423a.

Thereafter, the data operator 423a may obtain (e.g., is configured to determine) the ratio of the fault heat amount Q with respect to the detection time ΔT as the actual heat transfer coefficient Z, as expressed in equation (1), and thus the actual heat transfer coefficient Z may be determined based on the ratio, the fault heat amount Q, and the detection time ΔT. The actual heat transfer coefficient Z indicates an actual heat transfer from the heat source to the upper surface of the operation fault package OFP through the passing dies.

$$Z = \frac{Q}{\Delta T} \quad (1)$$

wherein, in equation (1), ΔT is the thermal detection time, Q is the amount of the fault heat H and Z is the actual heat transfer coefficient.

The position calculator 423b may detect a ratio of the actual heat transfer coefficient Z with respect to the heat transfer coefficient α of the component dies D as the vertical point VP of the fault F, as expressed in equation (2).

$$VP(z) = \frac{Z}{\alpha} \quad (2)$$

wherein, in equation (2), VP is the vertical point of the defect F in the third direction z (e.g., the stack direction), α is the heat transfer coefficient of the component dies D, and Z is a variable in the third direction z (e.g., the actual heat transfer coefficient).

When the fault heat amount Q may be detected by the heat sensor 320 and the detection time ΔT may be calculated in the data operator 423a, the actual heat transfer coefficient Z may be obtained by equation (1) and the vertical point VP of the fault F may be obtained by equation (2).

Thus, the vertical point VP may indicate a length or a height from the heat source or the fault F to the upper surface of the operation fault package OFP in the third direction z toward the heat sensor 320 that may be arranged over the operation fault package OFP. Therefore, an integer just below the vertical point VP may indicate a stack number (e.g., stack position) of the component dies D over the fault F, or a stack number of the passing dies.

When the fault F of the operation fault package OFP in FIG. 6 may be arranged at a central portion of the third component dies D3, the vertical point VP of the fault F may be determined in a range between more than three and less than four due to the length or the height between the fault F and an upper surface of the third component die D3.

Thus, the integer 3 just below the vertical point VP may indicate the stack number of the component dies D arranged on the third component die D3. That is, the integer just below the vertical point VP may indicate the stack number of the passing dies on and over the fault die FD. Since the fault die FD may be positioned under the passing dies, the stack position of the fault die FD may be detected as a component die D that may be positioned just under the lowermost component die of the passing dies. Since the stack number of the passing dies may be a rounding down integer just below the vertical point VP, the stack position of the fault die FD may be selected as a rounding up integer just above (e.g., the next stack position above) the vertical point VP. In FIG. 6, since the lowermost component die of the passing dies may be the second component die D2, the third component die D3, which may be positioned at a fourth stack position in the operation fault package OFP along the third direction z, may be detected as the fault die FD. The four may be a rounding up integer of the vertical point VP.

Accordingly, the position calculator 423b may be configured to determine the vertical point VP of the fault F by following the above equation (2) and determining a stack position of the fault die FD as a rounded-up integer that is the next integer corresponding to the next stack position above the vertical point VP.

The die database 423c may store die information of (e.g., associated with) the component dies D of the semiconductor packages PUT. For example, a stack position of each component die D in the operation fault package OFP and the heat transfer coefficient α of each component die D in the operation fault package OFP may be stored in the die database 423c together with any other die characteristics of the component dies D. The die characteristics may include various physical and/or chemical characteristics such as the die size, the process-based characteristics of the die and the position of the contact pad of the buffer substrate B. The die information may be changed according to the test requirements of the test apparatus 1000.

The die selector 423*d* may select the die information of (e.g., associated with) the fault die FD from the die database 423*c*. Each of the component dies D in the operation fault package OFP may be identified from one another by a die identifier that may be ordered downwards sequentially from an uppermost buffer substrate B. The die information of the die database 423*c* may also be identified by the same die identifier, so that the same die identifier may designate the same die in the semiconductor package PUT and the die database 423*c*.

When the stack position of the fault die FD may be obtained by the position calculator 423*b*, the die identifier of the fault die FD may be transferred to die selector 423*d*. Then, the die selector 423*d* may select the die information of the die database 423*c* based on the die identifier and may store the fault die information in a storing unit (not shown). Accordingly, the die selector 423*d* may be configured to select a particular component die D positioned at the determined stack position in the operation fault package OFP as the fault die FD and obtain die information associated with the fault die FD from the die database 423*c* based on selecting the fault die FD.

Accordingly, the operation fault package OFP may be determined by the sequential and continuous process of the operation test as the 2-dimensional fault package point FPP and the fault F of the operation fault package OFP may be determined as the 1-dimensional vertical point VP by calculating the actual heat transfer coefficient Z with respect to the heat transfer coefficient of the component dies D. Thus, the vertical point VP of the fault F may be specified as 3-dimensional point.

That is, the fault package point FPP may be specified as 2-dimensional point (x, y) and the vertical point VP of the fault F may be specified as 1-dimensional point (z), the operation fault package OFP may be specified as 3-dimensional point (x, y, z).

Referring again to FIG. 1, the test apparatus 1000 may further include a data transfer center 500 transferring (e.g., configured to transfer) the fault die information to surroundings (e.g., an exterior apparatus that is external to the test apparatus 1000) from the die selector 423*d*. For example, the fault die information may be transferred to a die bonding apparatus that may be arranged at an outside of the test apparatus 1000.

For example, the data transfer center 500 may include a data converter (not shown) for converting the fault die information into data signals and a transfer unit for transferring the data signals to the die bonding apparatus. The transfer unit may include a wire or a wireless communication device.

When the chip stack package CSP or the die stack package DSP may be manufactured in the die bonding apparatus, the fault die information may be instantaneously transferred to the die bonding apparatus and a correction process may be conducted in the die bonding apparatus for preventing the fault die FD in the die bonding process. For example, the fault die FD may be replaced another faultless component die or the fault F of the die D corresponding to the stack position of the fault die D may be sufficiently cured before the die having the fault F may be loaded into the chamber of the die boding apparatus. Accordingly, the instantaneous feedback of the fault die information to the die boding apparatus may reduce the operation fault package OFP and may increase the efficiency of the die bonding process.

According to the conventional die bonding process, the operation test and the fault detection are individually conducted in their own chambers, so it takes a long time for the die bonding apparatus to get the fault die information because the operation-tested chip stack package is necessarily transferred to another chamber for conducting the fault detection. Thus, the feedback of the fault die information to the die bonding apparatus is so late that there is a limit to reduce the operation fault package OFP in the die bonding process.

However, according to the present inventive concepts of the test apparatus 1000, the operation test and the fault detection may be sequentially and continuously conducted in a single test chamber 100 and thus the fault die FD may be found in a short time. Thus, the feedback of the defect die information to the die bonding apparatus may be conducted instantaneously, so that the fault package may be sufficiently reduced in the die bonding process.

While some example embodiments discloses that a single securing assembly 120 may be provided with the test chamber 100 and thus the operation test and the fault detection may be conducted to a group of the chip stack packages on a single buffer substrate B, a plurality of the securing assemblies would be provided with the test chamber 100, and as a result, many groups of the chip stack packages on a plurality of buffer substrates B would simultaneously experience the operation test and the fault detection.

In such a case, a plurality of the fault heat detectors 300 may be provided with the test chamber 100 in such a configuration that the fault heat detector 300 and the securing assembly 120 may be matched by one to one. Thus, the fault detection may be simultaneously conducted to every group of the chip stack packages by a unit of the securing assembly 120. The fault position controller 420 may individually control the fault heat detectors 300, respectively.

Figure 8:
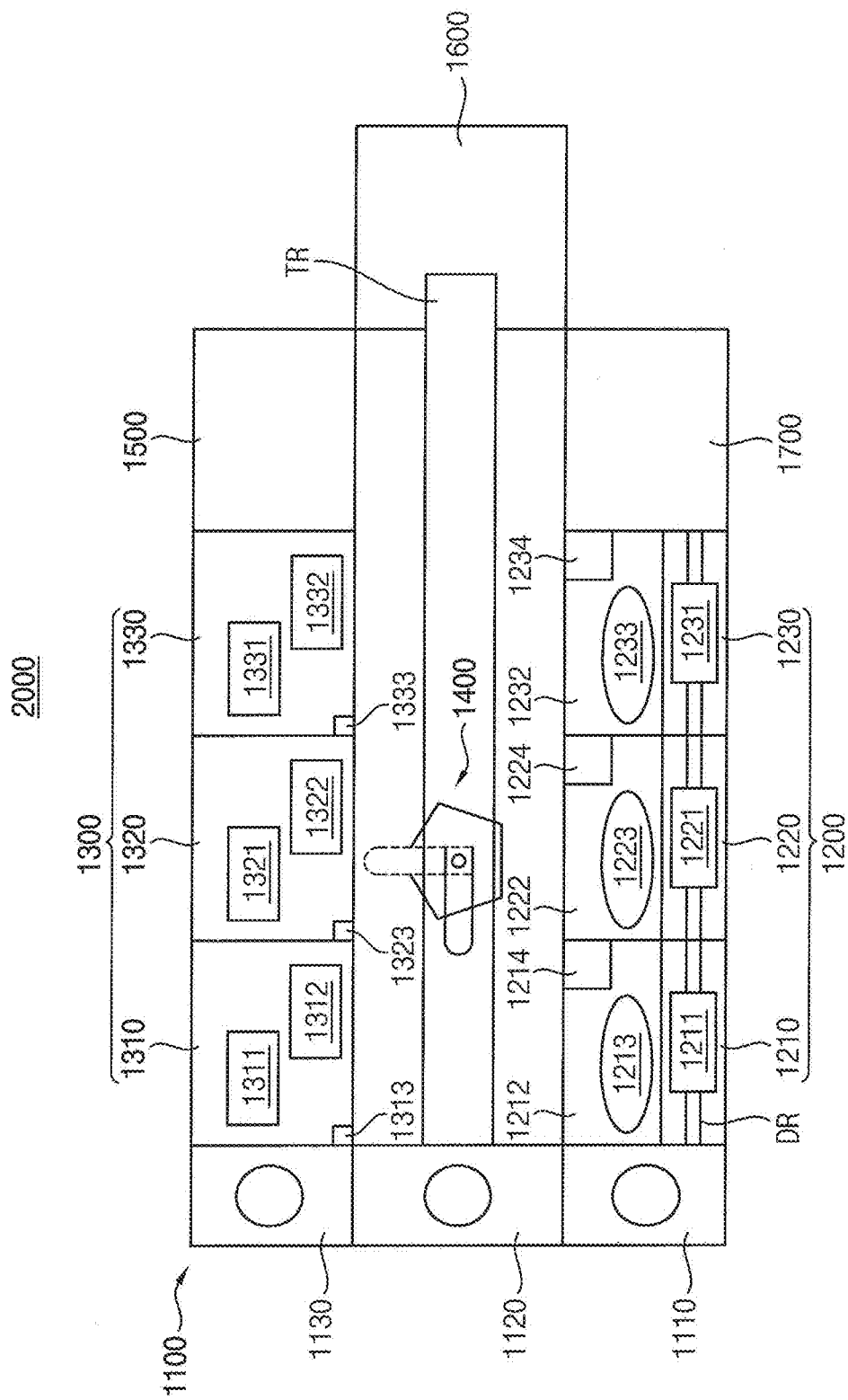
FIG. 8 is a structure view illustrating a manufacturing system including the test apparatus shown in FIG. 1 in accordance with some example embodiments of the present inventive concepts.

FIG. 8 is a structure view illustrating a manufacturing system including the test apparatus shown in FIG. 1 in accordance with some example embodiments of the present inventive concepts. In FIG. 8, a chip stack package may be, in some example embodiments, manufactured in the package manufacturing system 2000. However, any other semiconductor packages PUT such as the die stack package DSP may also be manufactured in the manufacturing package system 2000 as long as the operation test and the fault detection may be conducted in the same test chamber (e.g., without chamber exchange).

Referring to FIG. 8, a package manufacturing system 2000 in accordance with some example embodiments of the present inventive concepts may include a load port 1100, at least a die bonding apparatus 1200, at least a package test apparatus 1300, a package transfer apparatus 1400 for transferring semiconductor packages between the die bonding apparatus 1200 and the package test apparatus 1300, a die sorting apparatus 1500 separating the semiconductor packages into individual semiconductor packages PUT and sorting the semiconductor packages PUT into good packages and bad packages, a packing apparatus 1600 for packing the good packages into semiconductor goods and a discarding apparatus 1700 for gathering and discarding the bad packages.

A plurality of chips may be formed on a wafer (not shown) by a series of the conventional semiconductor manufacturing processes. Then, a plurality of the wafers may be received in a wafer cassette and the wafer cassette may be transferred onto the load port 1100 of the package manufacturing system 2000.

When the wafer cassette may be positioned on an input port 1110 of the load port 1100, some of the wafers may be supplied to component die separators 1211, 1221 and 1231 and the rest of the wafers may be supplied to an inspection port 1120. The wafer may be individually picked up from the wafer cassette at the input port 1110 and may be supplied to each of the component die separators 1211, 1221 and 1231. When the component die separators 1211, 1211 and 1231 may be full of the wafer, the wafer cassette may be loaded onto the inspection port 1120.

The wafer may be individually picked up from the wafer cassette at the inspection port 1120 and may be loaded individually into the die bonding apparatus 1200. The die bonding apparatus 1200 may include a plurality of die bonding units 1210, 1220 and 1230, and thus a plurality of the die bonding processes may be individually conducted in each of the bonding chambers. After the die bonding process, the wafer may be transferred to the package test apparatus 1300 by the package transfer apparatus 1400. It will be understood that the die bonding apparatus 1200 is configured to bond a plurality of component dies D to each of one or more chips on a wafer to thereby manufacture a plurality of semiconductor packages PUT on the wafer. When the wafers in the wafer cassette may be loaded into the die bonding apparatus 1200 from the inspection port 1120, the empty wafer cassette may be transferred to an output port 1130 and then the wafer cassette may be removed from the package manufacturing system 2000. It will be understood that the package transfer apparatus 1400 may be configured to transfer the wafer on which the semiconductor packages PUT (e.g., chip stack packages CSP) are located to the package test apparatus 1300 from the die bonding apparatus 1200.

The number of the die bonding units 1210, 1220 and 1230 may be varied according to the requirements of the package manufacturing system 2000. In some example embodiments, three die bonding units 1210, 1220 and 1230 and three test units 1310, 1320 and 1330 may be provided with the package manufacturing system 2000.

The die bonding apparatus 1200 may include a first, a second and a third die bonding unit 1210, 1220 and 1230 conducting the die bonding process independently from one another.

Each of the die bonding units 1210, 1220 and 1230 may include component die separators 1211, 1221 and 1231, bonding chambers 1212, 1222, 1232, die bonders 1213, 1223 and 1233 sequentially stacking the component dies on the chip of the wafer by a die bonding process, and a die bonding controller 1214, 1224 and 1234 for controlling the die bonders 1213, 1223 and 1233 and to repeat the die bonding process until a predetermined number of the component dies D may be stacked on the chip of the wafer.

The wafer picked up from the wafer cassette at the input port 1110 may move into one of the component die separators 1211, 1221 and 1231 along a dicing rail. Then, each chip of the wafer may be separated into dies that may be provided into respective die bonder 1213, 1223 and 1233 as a component die D. Each of the component dies D may be picked up and mounted on one of the chips by a picker assembly (not shown).

The wafer in the wafer cassette located at the inspection port 1120 may be individually picked up from the wafer cassette and may be loaded into bonding chambers 1212, 1222 and 1232 as the buffer substrate B of the chip stack package CSP. The buffer substrate B may be secured to each die bonder 1213, 1223 and 1233 and the component dies D may be bonded onto each chip until the expected number of the component dies D may be stacked on the chip in respective bonding chambers 1212, 1222 and 1232. Accordingly, a plurality of chip stack packages CSP may be formed in the package manufacturing system 2000.

In contrast, when an interposer having a plurality of internal electric circuits may be loaded into the bonding chambers 1212, 1222 and 1232 as the buffer substrate B of the semiconductor package PUT. The interposer may be secured to each die bonder 1213, 1223 and 1233 and the component dies D may be bonded onto each stack areas until the expected number of the component dies D may be stacked on each stack area in respective bonding chambers 1212, 1222 and 1232. Accordingly, a plurality of die stack packages CSP may be formed in the package manufacturing system 2000.

Each die bonder 1213, 1223 and 1233 may pick up the component die D from the component die separator 1211, 1221 or 1231 and may bond each component die D onto the chip of the wafer or the stack area of the interposer. Therefore, a plurality of the chip stack packages or the die stack packages may be formed in each bonding chambers 1212, 1222 and 1232. The die bonding process in each of the bonding chambers 1212, 1222 and 1232 may be individually controlled by respective die bonding controller 1214, 1224 and 1234. A plurality of the contact bumps CB may be arranged on the rear surface of the wafer for signal communication with another system.

The chip stack packages CSP on the wafer may be transferred into one of the test unit 1310, 1320 and 1330 of the package test apparatus 1300 by the package transfer apparatus 1400.

Each of the test unit 1310, 1320 and 1330 (e.g., test chamber) may include an operation tester 1311, 1321 and 1331 for testing operation characteristics of each chip stack packages CSP, a fault heat detector 1312, 1322 and 1332 detecting the fault F of the operation fault package OFP in 3-dimensional coordinates and selecting a component die D having the fault F as a fault die FD and a data transfer unit 1313, 1323 and 1333 for transferring the fault die information to the die bonding apparatus 1200.

Particularly, the chip stack package CSP may be secured to the securing assembly 120 in such a way that an uppermost component die D may be secured to the securing assembly 120 by using a dicing tape DT and the contact bumps CB may face the operation tester 1311, 1321 and 1331 and the fault heat detector 1312, 1322 and 1332.

Thus, the operation test and the fault detection may be sequentially and continuously conducted to each of the chip stack packages CSP in the package test apparatus 1300, so the fault F and the fault die FD in the operation fault package OFP may be obtained in the package test apparatus 1300 in a short time after the completion of the die bonding process. Accordingly, it will be understood that the package test apparatus 1300 is configured to enable an operation test to be performed on the plurality of semiconductor packages PUT manufactured by the die bonding apparatus 1200, to detect whether least one semiconductor package PUT is an operation fault package OFP having an inner fault F. The package test apparatus 1300 is further configured to enable fault heat detection to be performed on the plurality of semiconductor packages PUT to detect a vertical point VP of the fault F in the operation fault package OFP. The package test apparatus 1300 is configured to enable the operation test and the fault heat detection test to be performed sequentially and continuously on the semiconductor packages PUT without chamber exchange occurring between the operation test and the fault heat detection.

In addition, the fault die information may be transferred to the die bonding controllers 1214, 1224 and 1234 in a real time, so that the fault F may be minimized or prevented in a subsequent die bonding process for forming the chip stack packages CSP. Thus, the process efficiency of the die bonding process may significantly increase due to the continuous performance of the operation test and the fault detection in a single test unit 1310, 1320 and 1330.

Prior to the unloading of the chip stack packages CSP from the package test apparatus 1300, the operation fault packages OFP may experience a marking process in which the specifications of the bad operation and the fault position FP may be marked on each operation fault package OFP.

Each of the test units 1310, 1320 and 1330 may have substantially the same structures and configurations as the test apparatus 1000 described in detail with reference to FIGS. 1 to 7. Thus, any detailed descriptions on the same elements will be omitted hereinafter.

When the operation test and the fault detection may be completed in the package test apparatus 1300, the chip stack package CSP may be unloaded from the package test apparatus 1300 and may be transferred to the die sorting apparatus 1500 by the package transfer apparatus 1400.

For example, when a tensional force may be applied to the dicing tape DT in the die sorting apparatus 1500, the chip stack packages CSP may be individually separated into pieces by a unit of the chip of the wafer. Thus, a plurality of individual chip stack packages CSP may be generated in the die sorting apparatus 1500 in such a configuration that the chip of the wafer may be provided as a lowermost die and a plurality of the component dies D may be stacked on the lowermost die.

The normal packages OP, which may be normally operated in the operation test, may be transferred to the packing apparatus 1600 from the die sorting apparatus 1500 and may be packed into sellable semiconductor goods in the packing apparatus 1600. In contrast, the operation fault packages OFP may be transferred to the discarding apparatus 1700 in which the operation fault packages OFP may be gathered and discarded as bad packages.

According to the package manufacturing system 2000, a plurality of the chip sack packages CSP may be manufactured and be automatically sorted into good packages and bad packages. Particularly, the operation test to the chip stack packages CST and the fault detection to the operation fault packages OFP may be sequentially and continuously conducted in a single test chamber. Thus, the die information of the fault die FD may be transferred to the die bonding apparatus 1200 in a real time. Therefore, the process efficiency of the die bonding process may be sufficiently improved in the package manufacturing system 2000.

Figure 9:
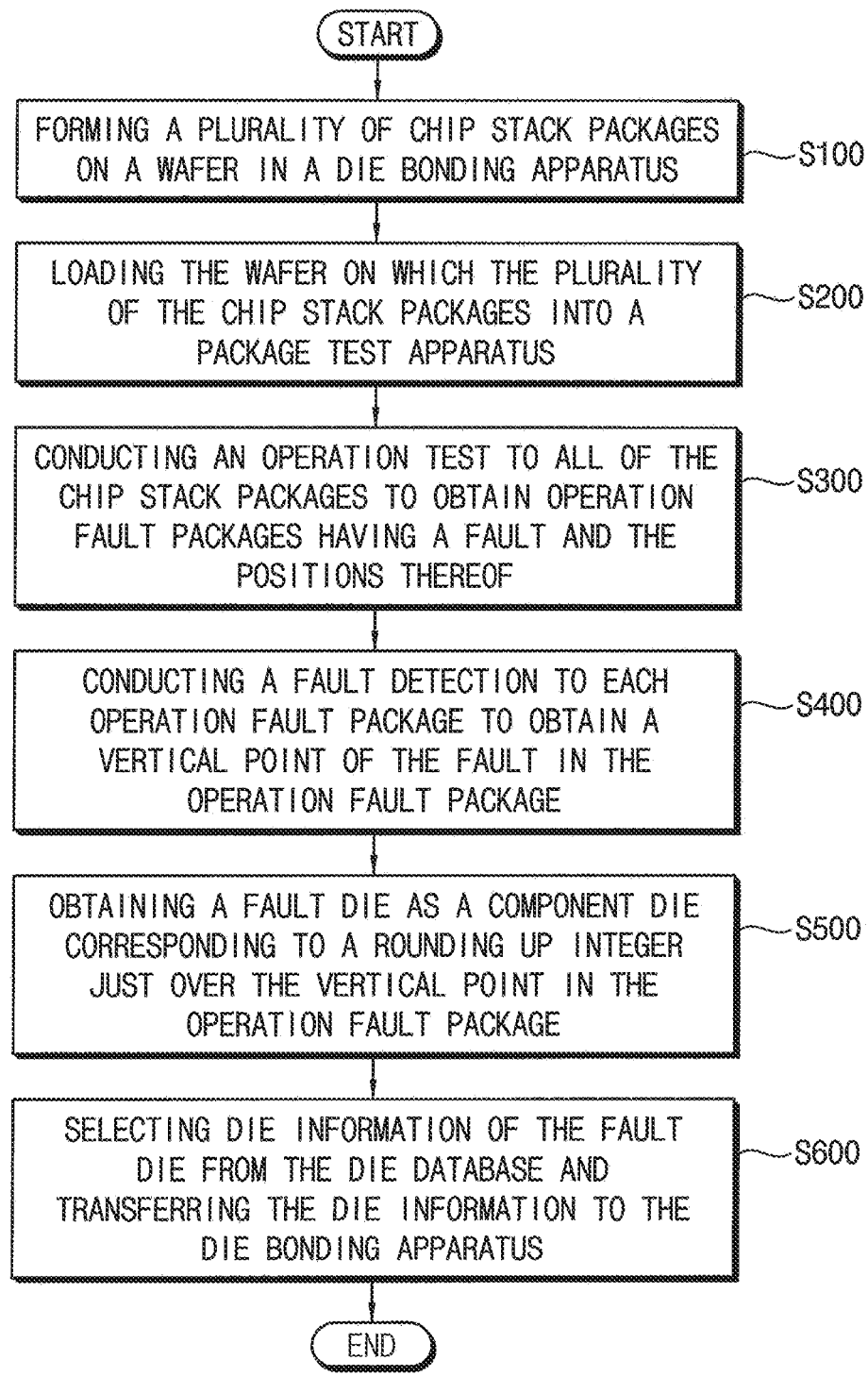
FIG. 9 is a flow chart showing processing steps of a method of manufacturing semiconductor packages in the package manufacturing system shown in FIG. 8.

FIG. 9 is a flow chart showing processing steps of a method of manufacturing semiconductor packages in the package manufacturing system shown in FIG. 8. The method may be implemented by one or more portions of any test apparatus according to any of the example embodiments herein.

Referring to FIGS. 1 to 9, a plurality of the component dies D may be stacked on the buffer substrate B in the die bonding apparatus 1200, thereby forming (e.g., manufacturing) a plurality of semiconductor packages PUT such as chip stack packages CSP or die stack packages DSP (step S100). In some example embodiments, the buffer substrate B may include a wafer on which a plurality of chips, and thus the substrate packages PUT may be formed into the chip stack package CSP.

The wafer may be loaded into the die bonding apparatus 1200 and a plurality of the component dies D may be bonded onto the chip of the wafer by the die bonder 1213, 1223 and 1233. Thus, a plurality of the chip stack packages CSP may be integrally formed on the wafer.

Then, the wafer on which the plurality of the semiconductor packages PUT (e.g., chip stack packages CSP) are located may be loaded into the package test apparatus 1300 (step S200).

For example, the wafer holding the chip stack packages CSP may be unloaded from the die bonding apparatus 1200 and may be loaded into the package test apparatus 1300 by the package transfer apparatus 1400.

Then, an operation test may be firstly conducted to (e.g., performed on) all of the semiconductor packages PUT (e.g., chip stack packages CSP) on the buffer substrate B in such a way that one or more non-operating operation fault packages OFP of the semiconductor packages PUT may be detected together (e.g., the operation test may be conducted to the semiconductor packages PUT to detect whether at least one semiconductor package PUT is an operation fault package OFP having a fault F), and, in response to the detection of one or more operation fault packages OFP, a fault package point FPP at which one or more detected operation fault packages OFP are located in the plurality of semiconductor packages PUT may be identified, and a fault map FM on which the positions FPP of the one or more operation fault packages OFP of the semiconductor packages PUT may be marked (e.g., indicated) may be generated (e.g., created, established, etc.) (step S300).

For example, the operation tester 200 may make contact with the contact bumps CB of the chip stack packages CSP, respectively, and the test signal may be applied to the contact bumps CB. The operation tester 200 may include the probe assembly 220 connected to the test head 210 for testing the electrical shorts and the DC current test terminal 240 for conducting the burn-in test. Then, one or more chip stack packages CSP, which may not operate in spite of the test signal and thus for which the operation signal may not be detected by the operation tester 200, may be classified as (e.g., detected as) a non-operating package or an operation fault package OFP. Accordingly, the operation tester 200 may conduct the operation test to the semiconductor package PUT to detect whether at least one semiconductor package (e.g., CSP) of the semiconductor packages PUT is an operation fault package OFP having a fault F and to identify a fault package point FPP at which the operation fault package OFP is located in the plurality of semiconductor packages PUT in response to detecting the operation fault package OFP.

Particularly, the fault map FM may include a base map BM indicating a planar shape of the wafer and a plurality of package images PI corresponding to the chip stack packages CSP, respectively, on the base map BM. The position of the operation fault package OFP may be marked on the fault map FM. Each package image PI may be specified on the fault map FM in a 2-dimensional coordinate system and the operation fault package OFP may be pointed on the fault map FM by 2-dimensional coordinates. Thus, the fault package point FPP may be specified on the fault map FM and the operation fault packages OFP may be marked at the fault package point FPP of the fault map FM.

Then, the fault detection process may be sequentially conducted to (e.g., performed on) the detected operation fault packages OFP continuously with (e.g., subsequently to and/or at least partially concurrently with) the operation test being performed at S300, to thereby obtain (e.g., determine) a 1-dimensional vertical point VP of the fault F and a 3-dimensional fault position FP of the fault F in the operation fault package OFP (step S400).

FIG. 10 is a block diagram showing a process step for obtaining the 3-dimensional fault position shown In FIG. 9. The method may be implemented by one or more portions of any test apparatus according to any of the example embodiments herein.

Referring to FIG. 10, the signal unit 310 and the heat sensor 320 may move over the chip stack package CSP in such a way that the signal unit 310 and the heat sensor 320 may be aligned with the operation fault package OFP in the third direction z (step S410).

When the operation test may be completed and the fault map FM indicating fault package points FPP at which the operation fault packages OFP are located in the semiconductor packages PUT may be generated, the fault position controller 420 may control the signal unit 310 to apply the detection signal for detecting the fault F to one or more detected operation fault packages OFP. For example, the driver 330 may move the signal unit 310 and the heat sensor 320 to over a fault package point FPP indicated in the fault map FM (and thus move the signal unit 310 and the heat sensor 320 to be positioned over a detected operation fault package OFP) under the control of the fault position controller 420. The signal unit 310 and the heat sensor 320 may be positioned over the detected operation fault package OFP by a linear motion and a rotation of the driver 330.

Then, the detection signal may be applied to the operation fault package OFP at a first time T1 by the signal unit 310 (step S420).

For example, the signal unit 310 may move downwards until the signal unit 310 may make contact with the contact bump CB of the operation fault package OFP, and then the detection signal may be applied to the operation fault package OFP. In addition, the time when the detection signal may be applied may be detected and stored as the first time T1. The first time T1 may be transferred to the position detector 423.

When an electric power may be applied to the operation fault package OFP as the detection signal, the fault heat H such as a Joule heat may be generated from the fault F in the operation fault package OFP. When the electric power may be applied to the normal operating packages OP, no fault heat may be generated from the normal operating packages OP. The fault heat H may be radiated from the operation fault package OFP at a temperature higher than that of a normal operation heat of the normal operation package OP.

Then, the fault heat H may flow to an uppermost surface or a lowermost surface of the operation fault package OFP from the heat source or the fault F and may be detected from the uppermost or the lowermost surface of the operation fault package OFP by the heat sensor 320. The time when the fault heat H may be firstly detected may be checked as a second time T2. Accordingly, the amount of the fault heat H and the second time T2 may be detected and stored in the heat sensor 320 (step S430).

When the fault heat H of the fault F may flow to the uppermost or the lowermost surface of the operation fault package OFP through at least one of the component dies D, the heat sensor 320 may detect the fault heat H from the surface of the operation fault package OFP. The heat sensor 320 may also detect the second time T2 at which the fault heat H may be firstly detected. The amount Q of the fault heat H and the second time T2 may be transferred to the position detector 423.

When the fault heat amount Q, the first time T1 and the second time T2 may be transferred to the position detector 423, the detection time $\Delta T$ may be obtained as the time difference between the first time T1 and the second time T2 and the actual heat transfer coefficient Z may be calculated as a ratio of the fault heat amount Q with respect to the detection time $\Delta T$ (step S440).

For example, the fault heat amount Q, the first time T1 and the second time T2 may be transferred to the data operator 423a of position detector 423, and then the detection time $\Delta T$ may be obtained and stored at first as the time difference between the first time T1 and the second time T2 by using a computer algorithms in the data operator 423a.

Thereafter, the data operator 423a may calculate the ratio of the fault heat amount Q with respect to the detection time $\Delta T$ as the actual heat transfer coefficient Z, as expressed in the above equation (1). The actual heat transfer coefficient Z indicates an actual heat transfer from the fault F or the heat source to the upper surface of the operation fault package OFP through the passing dies. The actual heat transfer coefficient Z may be transferred to the position calculator 423b.

Then, the ratio of the actual heat transfer coefficient Z with respect to the heat transfer coefficient $\alpha$ of each component die D may be calculated and may be stored as the vertical point of the fault F in the operation fault package OFP in the position calculator 423b (step S450).

The heat transfer coefficient $\alpha$ of the component die D may be transferred from the die database 423c to the position calculator 423b and the actual heat transfer coefficient Z may be transferred to the position calculator 423b. Then, the ratio of the actual heat transfer coefficient Z with respect to the heat transfer coefficient $\alpha$ may be calculated by the above equation (2) and stored in the position calculator 423b as the vertical point VP of the fault F in the operation fault package OFP.

Since the actual heat transfer coefficient Z may indicate an actual heat transfer per a unit time and the heat transfer coefficient $\alpha$ may indicate a theoretical heat transfer per the same unit time at each component die D, the ratio of the actual heat transfer coefficient Z with respect to the heat transfer coefficient $\alpha$ may indicate a heat transfer path or the component dies through which the fault heat H may pass from the fault F to the upper surface of the operation fault package OFP. That is, the ratio of the actual heat transfer coefficient Z with respect to the heat transfer coefficient $\alpha$ may determine a distance between the fault F and the to the upper surface of the operation fault package OFP, to thereby determine the vertical point of the fault F.

In such a case, the vertical point VP of the fault F in the operation fault package OFP may be provided as a 1-dimensional position in the third direction z. However, since the point of the operation fault package OFP may be provided as a 2-dimensional fault package position FPP on the fault map FM, the position of the fault F of the operation fault package OFP may be determined as a 3-dimensional fault position FP in the chip stack packages CSP.

Then, the component die D corresponding to a rounding up integer just over the vertical point F of the fault F may be obtained (e.g., determined) as the fault die FD in the operation fault package OFP (step S500).

When the vertical point VP of the fault F may be obtained, the stack number of the passing dies through which the fault heat H may be transferred may be a rounding down integer just below the vertical point VP. Therefore, when the fault heat H may be detected over the operation fault package OFP, the stack position of the fault die FD may be positioned under the lowermost component die D of the passing dies because the fault die FD may be positioned under the passing dies.

For example, when the fault F may be positioned in the third component die D3 in the chip stack package CSP shown in FIG. 6 and the passing dies may include the second component die D2, the first component die D1 and the buffer substrate B, the vertical point VP may be obtained in a range about more three and less than about four. In such case, the stack number of the passing dies may be exactly 3 as the integer just below the vertical point VP, and as a result, the fault die FD may be inevitably third component die D3 under the lowermost component die D2 of the passing dies.

That is, the stack position of the fault die FD may be determined as a rounding up integer just over the vertical point VP of the fault F in the operation fault package OFP.

In contrast, the stack position of the fault die FD may also be obtained by a trial and error method.

The actual heat transfer coefficient Z may be compared with a combination of the heat transfer coefficients $\alpha$ of the component dies D by a trial and error methods until the difference between the actual heat transfer coefficient Z and the combination of the heat transfer coefficients $\alpha$ may be minimized. In such a case, the component dies D instituting the combination of the heat transfer coefficients $\alpha$ may indicate the passing dies, and the fault die FD may be determined as the component die D just below the lowermost component die of the passing die.

The die information of the fault die FD may be selected from the die database 423c and be transferred to the die bonding apparatus (step S600).

When the fault die FD may be detected in the operation fault package OFP, the die identifier of the fault die FD may be transferred to the die selector 423d and the die selector 423d may select the die information of the fault die FD from the die database 423c according to the die identifier. The die information of the fault die FD may include the heat transfer coefficient $\alpha$ and the stack position in the operation fault package OFP.

Then, the die information of the fault die FD may be transferred to the die bonding apparatus in a real time by the data transfer center 500.

For example, the die information of the fault die FD may be transferred to the die bonding controllers 1214, 1224 and 1234 of the die bonding apparatus 1200 in a real time, so that the process conditions of the die bonding process may be changed based on the die information of the fault die FD by the die bonding controllers 1214, 1224 and 1234. Accordingly, the fault F may be minimized or prevented at the operation fault package OFP in a subsequent die bonding process, to thereby reduce the manufacturing the operation fault package OFP.

Particularly, the feedback time for transferring the die information of the fault die FD may be significantly reduced in the die bonding process, so the process efficiency of the die bonding process may increase due to the continuous performance of the operation test and the fault detection in a single test unit 1310, 1320 and 1330.

According to some example embodiments of the present inventive concepts, the fault package position FPP of the operation fault package OFP and the fault position FP of the fault F may be sequentially and continuously obtained in a single test chamber. The heat sensor 320 may be provided with the test chamber in which the operation test may be conducted, so that the fault heat H may be detected instantaneously after the operation test. Then, the fault position FP, the fault die FD and the die information of the fault die FD may be obtained by the test controller 400 in a short time after the completion of the die bonding process for manufacturing the chip stack package or the die stack package.

The vertical point VP of the fault F may be calculated as a ratio of the actual heat transfer coefficient Z with respect to the heat transfer coefficient $\alpha$ of the component dies D of the operation fault package and the stack position of the fault die FD in the operation fault package OFP may be selected as a rounding up integer just over the vertical point VP.

The die information of the fault die may be transferred to the die bonding apparatus in a relatively short time after the die bonding process, and thus the fault F of the semiconductor packages may be rapidly prevented in a subsequent die bonding process, to thereby increase the reliability and the process efficiency of the die bonding process.

The foregoing is illustrative of example embodiments and is not to be construed as limiting thereof. Although some example embodiments have been described, those skilled in the art will readily appreciate that many modifications are possible in some example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as some example embodiments, are intended to be included within the scope of the appended claims.

What is claimed is:

1. A test apparatus for testing a plurality of semiconductor packages, the test apparatus comprising:
   a test chamber including a securing assembly at a bottom thereof, the securing assembly configured to secure the plurality of the semiconductor packages including a plurality of component dies to the securing assembly;
   an operation tester in the test chamber and configured to
      conduct an operation test to the plurality of semiconductor packages to detect whether at least one semiconductor package of the plurality of semiconductor packages is an operation fault package having a fault, and
      identify a fault package point at which the operation fault package is located in the plurality of semiconductor packages in response to detecting the operation fault package;
   a fault heat detector in the test chamber, the fault heat detector configured to detect fault heat generated from the operation fault package; and
   a test controller at an outside of the test chamber, the test controller configured to
      control the operation tester to conduct the operation test to the plurality of semiconductor packages, and
      control the fault heat detector subsequent to the operation test to detect the fault heat generated from the fault of the operation fault package to determine a vertical point of the fault and to determine a fault die having the fault.

2. The test apparatus of claim 1, wherein the fault heat detector includes:
a signal emitter configured to apply a detection signal to the operation fault package;
a heat sensor configured to be positioned above or beneath the operation fault package and configured to detect the fault heat from a surface of the operation fault package; and
a driver in the test chamber and communicatively coupled to the signal emitter and the heat sensor, such that the driver is configured to drive the signal emitter and the heat sensor to move over the operation fault package.

3. The test apparatus of claim 2, wherein the signal emitter includes a contact probe configured to make contact with a contact bump of the operation fault package and apply the detection signal to the operation fault package.

4. The test apparatus of claim 2, wherein
the fault heat includes a resistive heat generated from the fault in response to the detection signal, and
the heat sensor includes an infrared camera configured to detect the resistive heat at at least a position over the operation fault package or a position below the operation fault package.

5. The test apparatus of claim 4, wherein the securing assembly includes:
a support plate on which the plurality of semiconductor packages are secured and having a plurality of location marks corresponding to separate, respective semiconductor packages; and
a cylinder wall extending downwards from the support plate and shaped into a hollow shaft defining a central space at a central portion such that the heat sensor is positioned in the central space beneath the support plate.

6. The test apparatus of claim 2, wherein the test controller includes:
a fault package controller configured to control the operation tester to
conduct the operation test,
detect the operation fault package based on the operation test, and
generate a fault map on which the fault package point of the operation fault package is marked; and
a fault position controller configured to control the fault heat detector to detect the fault heat generated from the fault of the operation fault package and determine the vertical point of the fault and the fault die having the fault in the operation fault package subsequent to the operation test.

7. The test apparatus of claim 6, wherein the fault position controller includes:
a first control console configured to control the signal emitter to apply the detection signal to the operation fault package at a first time;
a second control console configured to control the heat sensor to detect the fault heat from the fault in the operation fault package at a second time; and
a position detector configured to determine the vertical point by calculating a ratio of an actual heat transfer coefficient with respect to heat transfer coefficients of the plurality of component dies to select a particular component die of the plurality of component dies that corresponds to the vertical point as the fault die.

8. The test apparatus of claim 7, wherein the position detector includes:

a data operator connected to the first control console and the second control console and configured to determine the actual heat transfer coefficient by following equation (1), $$Z = \frac{Q}{\Delta T} \quad (1)$$

wherein in equation (1), $\Delta T$ is a thermal detection time, $Q$ is an amount of the fault heat and $Z$ is the actual heat transfer coefficient;
a position calculator configured to determine the vertical point of the fault by following equation (2) and obtaining a stack position of the fault die as a rounded-up integer that is a next stack position above the vertical point, $$VP(z) = \frac{Z}{\alpha} \quad (2)$$

wherein, in equation (2), VP represents the vertical point of the fault in a stack direction of the operation fault package, $\alpha$ represent the actual heat transfer coefficient of the component dies of the operation fault package, and Z represents a variable in the stack direction of the operation fault package;
a die database storing die information associated with the component dies of the plurality of semiconductor packages, the die information including the actual heat transfer coefficient and stack position of each component die in the operation fault package; and
a die selector configured to select a particular component die positioned at the stack position in the operation fault package as the fault die and obtain die information associated with the fault die from the die database.

9. The test apparatus of claim 1, wherein
the operation tester includes a probe assembly including
a test head positioned at an upper portion of the test chamber and configured to transfer a test signal to each semiconductor package of the plurality of semiconductor packages, and
a plurality of probes movably secured to the test head and configured to selectively contact separate, respective semiconductor packages of the plurality of semiconductor packages to simultaneously apply the test signal to the plurality of semiconductor packages, and
the test chamber includes a chamber structure configured to conduct an electrical die sorting (EDS) process to the plurality of semiconductor packages.

10. The test apparatus of claim 1, wherein the operation tester includes a DC current test terminal located at an upper portion of the test chamber and the test chamber includes a monitoring burn-in test chamber configured to enable a DC current test to be conducted.

11. The test apparatus of claim 1, further comprising a data transfer center configured to transfer die information of the fault die to an exterior apparatus.

12. The test apparatus of claim 1, wherein the plurality of semiconductor packages includes at least one of
a chip stack package in which a plurality of component dies is stacked on each chip on a wafer, or
a die stack package in which a plurality of component dies is stacked on each stack area of an interposer.

13. A manufacturing system for manufacturing semiconductor packages, the manufacturing system comprising:
- a die bonding apparatus configured to bond a plurality of component dies to each chip on a wafer to manufacture a plurality of semiconductor packages on the wafer;
- a package test apparatus configured to enable an operation test and fault heat detection to be performed sequentially and continuously on the plurality of semiconductor packages without chamber exchange, the operation test performed to detect whether at least one semiconductor package of the plurality of semiconductor packages is an operation fault package having a fault, the fault heat detection including detecting a vertical point of the fault in the operation fault package; and
- a package transfer apparatus configured to transfer the wafer on which the plurality of the semiconductor packages are located to the package test apparatus from the die bonding apparatus.

14. The manufacturing system of claim 13, wherein the package test apparatus includes:
- a test chamber including a securing assembly at a bottom thereof, the securing assembly configured to secure the plurality of the semiconductor packages to the securing assembly;
- an operation tester in the test chamber and configured to
  - conduct the operation test to the plurality of semiconductor packages, and
  - identify a fault package point at which the operation fault package is located in the plurality of semiconductor packages in response to detecting the operation fault package;
- a fault heat detector in the test chamber, the fault heat detector configured to detect fault heat generated from the operation fault package; and
- a test controller at an outside of the test chamber, the test controller configured to
  - control the operation tester to conduct the operation test to the plurality of semiconductor packages, and
  - control the fault heat detector subsequent to the operation test to detect the fault heat generated from the fault of the operation fault package to determine the vertical point of the fault and to determine a fault die having the fault.

15. The manufacturing system of claim 14, wherein the fault heat detector includes:
- a signal emitter configured to apply a detection signal to the operation fault package;
- a heat sensor configured to be positioned above or beneath the operation fault package and configured to detect the fault heat from a surface of the operation fault package; and
- a driver in the test chamber and communicatively coupled to the signal emitter and the heat sensor, such that the driver is configured to drive the signal emitter and the heat sensor to move over the operation fault package.

16. The manufacturing system of claim 15, wherein the test controller includes:
- a fault package controller configured to control the operation tester to conduct the operation test, detect the operation fault package based on the operation test, and generate a fault map on which the fault package point of the operation fault package is marked; and
- a fault position controller configured to control the fault heat detector to detect the fault heat from the fault and determine the vertical point of the fault and the fault die having the fault in the operation fault package in response to the operation test.

17. The manufacturing system of claim 16, wherein the fault position controller includes:
- a first control console configured to control the signal emitter to apply the detection signal to the operation fault package at a first time;
- a second control console configured to control the heat sensor to detect the fault heat from the fault in operation fault package at a second time; and
- a position detector configured to determine the vertical point by calculating a ratio of an actual heat transfer coefficient with respect to heat transfer coefficients of the plurality of component dies to thereby select a particular component die of the plurality of component dies that corresponds to the vertical point as the fault die.

18. The manufacturing system of claim 17, wherein the position detector includes:
- a data operator connected to the first control console and the second control console and configured to determine the actual heat transfer coefficient by following equation (1), $$Z = \frac{Q}{\Delta T} \tag{1}$$

wherein, in equation (1), $\Delta T$ is a thermal detection time, Q is an amount of the fault heat and Z is the actual heat transfer coefficient;
- a position calculator configured to determine the vertical point of the fault by following equation (2) and obtaining a stack position of the fault die as a rounded-up integer that is a next stack position above the vertical point, $$VP(z) = \frac{Z}{\alpha} \tag{2}$$

wherein, in equation (2), VP represents the vertical point of the fault in a stack direction of the operation fault package, $\alpha$ represent the actual heat transfer coefficient of the component dies of the operation fault package and Z represents a variable in the stack direction of the operation fault package;
- a die database storing die information associated with the component dies of the plurality of semiconductor packages, the die information including the actual heat transfer coefficient and stack positions of each component die in the operation fault package; and
- a die selector configured to select a particular component die positioned at the stack position in the operation fault package as the fault die and obtain die information associated with the fault die from the die database.

19. The manufacturing system of claim 14, the package test apparatus includes a data transfer center configured to transfer die information of the fault die to the die bonding apparatus.

20. A method of manufacturing a semiconductor package, the method comprising:
- manufacturing a plurality of semiconductor packages by bonding a plurality of component dies on a buffer substrate in a die bonding apparatus;
- loading the buffer substrate on which the plurality of semiconductor packages are located into a package test apparatus;

performing an operation test on all semiconductor packages of the plurality of semiconductor packages to detect whether at least one semiconductor package of the plurality of semiconductor packages is an operation fault package having a fault, and responding to detection of the operation fault package in the plurality of semiconductor packages by generating a fault map that indicates a position of the operation fault package in the plurality of semiconductor packages;

performing a fault detection process on the operation fault package continuously with the operation test to determine a vertical point of the fault in the operation fault package;

determining a component die having the fault as a fault die in the operation fault package; and selecting die information of the fault die from a die database and transferring the die information to the die bonding apparatus.

* * * * *